United States Patent
Lee et al.

(10) Patent No.: US 12,301,241 B2
(45) Date of Patent: May 13, 2025

(54) SIGNAL SYNTHESIS APPARATUS AND METHOD CAPABLE OF CORRECTING FREQUENCY OFFSET OF OPEN LOOP

(71) Applicants: SKAIChips Co., Ltd., Suwon-si (KR); Research & Business Foundation SUNGKYUNKWAN UNIVERSITY, Suwon-si (KR)

(72) Inventors: Kang Yoon Lee, Seoul (KR); Dong Gyu Kim, Suwon-si (KR); Yeon Jae Jung, Seoul (KR)

(73) Assignees: SKAIChips Co., Ltd., Seoul (KR); Research & Business Foundation SUNGKYUNKWAN UNIVERSITY, Seoul (KR)

( * ) Notice: Subject to any disclaimer, the term of this patent is extended or adjusted under 35 U.S.C. 154(b) by 0 days.

(21) Appl. No.: 18/395,965

(22) Filed: Dec. 26, 2023

(65) Prior Publication Data

US 2024/0364352 A1    Oct. 31, 2024

(30) Foreign Application Priority Data

Apr. 30, 2023 (KR) .......................... 10-2023-0056745

(51) Int. Cl.
| | | |
|---|---|---|
| H03L 7/099 | (2006.01) | |
| H03B 5/12 | (2006.01) | |
| H03C 3/09 | (2006.01) | |
| H03L 1/02 | (2006.01) | |
| H03L 7/093 | (2006.01) | |

(Continued)

(52) U.S. Cl.
CPC ............ *H03L 7/099* (2013.01); *H03B 5/1228* (2013.01); *H03C 3/0925* (2013.01); *H03C 3/0941* (2013.01); *H03C 3/095* (2013.01); *H03C 3/0958* (2013.01); *H03C 3/0991* (2013.01);

(Continued)

(58) Field of Classification Search
CPC ....... H03L 7/099; H03L 7/14; H03L 2207/06; H03L 7/093; H03L 7/103; H03L 1/02; H03L 7/0991; H03B 5/1228; H03B 5/1212; H03B 5/1243; H03B 5/1265;

(Continued)

(56) References Cited

U.S. PATENT DOCUMENTS 9,954,543 B1 *   4/2018   Chan ....................... H03L 7/099

FOREIGN PATENT DOCUMENTS

KR              102321030 B1       10/2021

* cited by examiner

*Primary Examiner* — Arnold M Kinkead
(74) *Attorney, Agent, or Firm* — Insight Law Group, PLLC; Seung Lee

(57) ABSTRACT

Disclosed is technology related to a signal synthesis apparatus that corrects an offset between a closed loop and an open loop to output a frequency-modulated signal. The signal synthesis apparatus includes a VCO configured to modulate and output a frequency signal in response to an input voltage by including a modulation cap bank having a plurality of capacitors, an energy storage unit configured to output a voltage using stored energy, a VCO input selector configured to connect the VCO to input of the energy storage unit in the case of a closed loop mode and connect the VCO to output of the energy storage unit in the case of an open loop mode, and a digital controller configured to control an operation mode of the VCO input selector and transmit a modulation control signal for adjusting a connection state of the capacitors of the modulation cap bank to the VCO.

12 Claims, 12 Drawing Sheets

(51) Int. Cl.
  *H03L 7/10* (2006.01)
  *H03L 7/14* (2006.01)
(52) U.S. Cl.
  CPC ............... *H03L 1/02* (2013.01); *H03L 7/093* (2013.01); *H03L 7/103* (2013.01); *H03L 7/14* (2013.01)
(58) Field of Classification Search
  CPC .... H03C 3/0925; H03C 3/0941; H03C 3/095; H03C 3/0958; H03C 3/0991
  USPC ........................ 331/167, 177 V, 117 FE, 183
  See application file for complete search history.

(a) Control Bit (b) Frequency (a)

(b)

SIGNAL SYNTHESIS APPARATUS AND METHOD CAPABLE OF CORRECTING FREQUENCY OFFSET OF OPEN LOOP

BACKGROUND OF THE INVENTION

Field of the Invention

The present invention relates to signal synthesis device technology, and more particularly to technology related to a signal synthesis apparatus and method capable of correcting an offset of an open loop in a frequency synthesis device using a phase-locked loop (PLL).

Description of the Related Art

With development of communication technology, various wired and wireless communication devices have been developed. Since development of wireless communication technology using radio frequency y (RF) does not require installation of wires, restrictions on installation locations of communication devices may be significantly relaxed, and thus the technology is widely used in IoT (Internet of Things) devices, etc.

In wireless communication, especially frequency-shift keying (FSK)-based wireless communication, it is important to generate an accurate frequency. To generate an accurate frequency, a phase-locked circuit or a PLL is mainly used.

Meanwhile, IoT devices are required to operate for a long time without battery replacement. To this end, research has been conducted on low-power operation, energy harvesting, etc.

Registered Patent No. 10-2321030, announced on Nov. 3, 2021, relates to "a signal synthesizer, a signal synthesis method, and a communication device that automatically compensate for a frequency shift difference according to a two-point modulation method of a PLL," and discloses a signal synthesizer including a voltage-controlled oscillator (VCO) that includes a first cap bank having a plurality of first capacitors of different capacitances, a second cap bank having a plurality of second capacitors of the same capacitance, and an inductor, and is configured to output a frequency signal according to the connected capacitors of the first cap bank and the second cap bank and the inductor, and a digital control block that includes a counter for counting a frequency signal and is configured to calibrate the first cap bank and the second cap bank using the counter.

However, offset correction for outputting an accurate frequency during an open loop operation for low-power operation of a PLL circuit has not yet been specifically disclosed.

SUMMARY OF THE INVENTION

Therefore, the present invention has been made in view of the above problems, and it is an object of the present invention to provide a signal synthesis apparatus and method capable of correcting an offset of an open loop which corrects an open loop offset even during low-power operation and outputs an accurate frequency.

It is another object of the present invention to provide a signal synthesis apparatus and method that output an accurate frequency by correcting frequency deviation due to a manufacturing process using a modulation control signal.

It is a further object of the present invention to provide a signal synthesis apparatus and method that output an accurate frequency by correcting frequency deviation due to environmental changes such as temperature and humidity changes.

The problems to be solved by the present invention are not limited to the problems mentioned above, and other problems not mentioned here may be clearly understood by those skilled in the art from the description below.

In accordance with an aspect of the present invention, the above and other objects can be accomplished by the provision of a signal synthesis apparatus configured to correct an offset between a closed loop and an open loop to output a frequency-modulated signal, the signal synthesis apparatus including a voltage-controlled oscillator (VCO), an energy storage unit, a VCO input selector, and a digital controller.

The VCO generates an output signal having a frequency corresponding to an input voltage by including a modulation cap bank having a plurality of capacitors of the same capacitance and an inductor, and modulates a frequency of the output signal according to a connection state of the capacitors of the modulation cap bank and the inductor to output a frequency-modulated signal.

The energy storage unit stores energy using an input voltage and outputs a voltage based on the stored energy.

The VCO input selector connects an input unit of the VCO to input of the energy storage unit when an operation mode is a closed loop mode, and connects the input unit of the VCO to output of the energy storage unit when the operation mode is an open loop mode.

The digital controller controls the operation mode of the VCO input selector and transmits a modulation control signal for adjusting the connection state of the capacitors of the modulation cap bank to the VCO.

According to an additional aspect, the digital controller includes a frequency offset calculator and a modulation control signal offset determinator.

The frequency offset calculator calculates a frequency offset based on a difference between a closed loop mode frequency of a VCO output signal output from the VCO when the VCO input selector operates in the closed loop mode and an open loop mode frequency of the VCO output signal output from the VCO when the VCO input selector operates in the open loop mode.

The modulation control 1 signal offset determinator determines an offset of the modulation control signal to compensate for the frequency offset based on a frequency change value according to a predetermined modulation control signal.

According to an additional aspect, the energy storage unit may include an energy storage element and a buffer. The energy storage element may be charged with an input voltage, and the buffer may be connected to an output unit of the energy storage element to maintain an output voltage of the energy storage element.

According to an additional aspect, the signal synthesis apparatus may further include a counter configured to measure a number of peaks of the VCO output signal.

According to an additional aspect, the digital controller may determine a frequency of the VCO output signal based on the number of peaks measured by the counter and a measurement time.

According to an additional aspect, the digital controller may further include a frequency change value determinator according to the modulation control signal. The frequency change value determinator according to the modulation control signal may determine a frequency change value according to the modulation control signal based on a difference between frequencies of VCO output signals each measured for each of a plurality of modulation control signals transmitted to the VCO.

According to an additional aspect, the digital controller may further include a modulation control signal gain determinator. The modulation control signal gain determinator may determine gain of the modulation control signal by comparing the frequency change value according to the modulation control signal with a design value.

According to an additional aspect, the digital controller may further include a modulation control signal determinator. The modulation control signal determinator may determine a modulation control signal required for frequency modulation of output data by applying the gain of the modulation control signal and the offset of the modulation control signal to a predetermined design value of the modulation control signal.

According to an additional aspect, the VCO may further frequency selection cap bank. The frequency selection cap bank may include capacitors controlled so that the capacitors are connected in parallel or open according to a frequency selection signal.

According to an additional aspect, the digital controller may further include a frequency selection signal determinator. The frequency selection signal determinator may generate a frequency selection signal, transmit the frequency selection signal to the VCO, and change the frequency selection signal based on a result of comparing a measured frequency of the VCO output signal with a predetermined reference frequency.

In accordance with another aspect of the present invention, there is provided a signal synthesis method of outputting a frequency-modulated signal by correcting an offset between a closed loop and an open loop, the signal synthesis method including supplying a reference voltage to an input unit of a VCO and setting a closed loop mode in which input of an energy storage unit is connected to the input unit of the VCO to supply a reference voltage input to the VCO to the energy storage unit, measuring a frequency of a VCO output signal output from the VCO to determine a closed loop mode frequency, blocking supply of the reference voltage input to the VCO and switching to an open loop mode in which output of the energy storage unit is connected to the input unit of the VCO to supply an output voltage of the energy storage unit to the input unit of the VCO, measuring a frequency of the VCO output signal to determine an open loop mode frequency, and calculating a frequency offset based on a difference from the closed loop mode frequency, and determining an offset of a modulation control signal to compensate for the frequency offset based on a frequency change value according to the modulation control signal for adjusting a connection state of the capacitors of a modulation cap bank.

According to an additional aspect, the signal synthesis method may further include generating a first modulation control signal, transmitting the first modulation control signal to the VCO, and measuring a first modulation frequency of a VCO output signal, generating a second modulation control signal, transmitting the second modulation control signal to the VCO, and measuring a second modulation frequency of the VCO output signal, and determining a frequency change value according to a modulation control signal based on a difference between the first modulation frequency and the second modulation frequency.

According to an additional aspect, the signal synthesis method may further include comparing a frequency change value according to the modulation control signal with a design value to determine gain of the modulation control signal.

According to an additional aspect, the signal synthesis method may further include applying an offset of the modulation control signal to a predetermined design value of the modulation control signal and gain of the modulation control signal to determine a modulation control signal required for frequency modulation of output data.

According to an additional aspect, the signal synthesis method may further include generating a frequency selection signal for controlling a capacitor of a frequency selection cap bank of the VCO, transmitting the frequency selection signal to the VCO, and measuring a frequency of the VCO output signal output from the VCO, and changing the frequency selection signal based on a result of comparing the frequency of the VCO output signal with a predetermined reference frequency.

According to an additional aspect, the signal synthesis method may further include setting an operation mode to a closed loop mode to connect input of the energy storage unit to the input unit of the VCO, and supplying a voltage input to the VCO to the energy storage unit, setting the operation mode to an open loop mode to connect output of the energy storage unit to the input unit of the VCO, and supplying an output voltage of the energy storage unit to the input unit of the VCO, and transmitting the modulation control signal to the VCO based on data to be output.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1A:
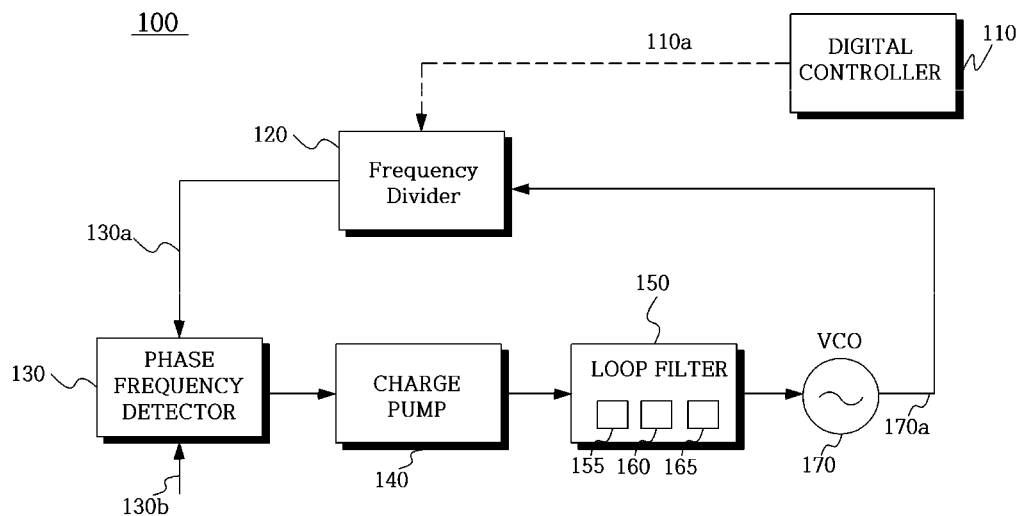
FIGS. 1A and 1B are schematic configuration diagrams for describing that a signal synthesis apparatus capable of correcting an offset of an open loop operates in a closed loop according to an embodiment.

The foregoing and additional aspects are embodied through embodiments described with reference to the accompanying drawings. It is understood that components of each embodiment may be combined in various ways within the embodiment or with components of other embodiments as long as there is no other mention or contradiction therebetween. Based on the principle that the inventor may appropriately define the concept of terms in order to describe the invention of the inventor in the best way, terms used in this specification and claims need to be interpreted as having meanings and concepts consistent with the description or proposed technical idea. In this specification, a module or part is a set of program instructions stored in a memory to be executable on a computer or processor, or may be implemented using a set of electronic components or circuits such as ASICs or FPGAs to execute these instructions. In addition, an operation of each module or part may be performed by one or more processors or devices. When components performing the same or similar functions have been previously described, redundant descriptions may be omitted. With regard to a component whose description has been omitted, the component may be understood with reference to a description of a component performing the same or a similar function described above.

Hereinafter, preferred embodiments of the present invention will be described in detail with reference to the attached drawings.

FIG. 1 is a schematic configuration diagram for describing that a signal synthesis apparatus capable of correcting an offset of an open loop operates in a closed loop according to an embodiment.

According to an aspect of the proposed invention, a signal apparatus 100 configured to output a frequency-modulated signal by correcting an offset between a closed loop and an open loop includes a voltage-controlled oscillator (VCO) 170, an energy storage unit 165, a VCO input selector 160, and a digital controller 110.

The VCO 170 includes a modulation cap bank having a plurality of capacitors of the same capacitance and an inductor to generate an output signal having a frequency corresponding to an input voltage, and modulates the frequency of the output signal according to a connection state of the capacitors of the modulation cap bank and the inductor to output a frequency-modulated signal.

The energy storage unit 165 stores energy using an input voltage and outputs a voltage based on the stored energy.

The VCO input selector 160 connects an input unit of the VCO to input of the energy storage unit when an operation mode is a closed loop mode, and connects the input unit of the VCO to output of the energy storage unit when the operation mode is an open loop mode.

The digital controller 110 controls the operation mode of the VCO input selector and transmits a modulation control signal for adjusting the connection state of the capacitors of the modulation cap bank to the VCO.

According to an additional aspect, the signal synthesis apparatus 100 may further include a frequency divider 120, a phase frequency detector 130, a charge pump 140, a low-pass filter 155, and an antenna 180.

Components of the signal synthesis apparatus 100 may be implemented on a single integrated circuit (IC) chip. However, some components may be separately configured on one or more IC chips or separate elements. In addition, a plurality of components may be combined to form one or more components. For example, the low-pass filter 155, the VCO input selector 160, and the energy storage unit 165, which are a plurality of modules, may be implemented by being integrated into a loop filter 150, which is one module.

Referring to FIG. 1A, the signal synthesis apparatus 100 according to an embodiment may operate in a closed loop as a typical PLL circuit, and generate a stable high-frequency RF signal using 1-point modulation.

The VCO 170 receives input of a voltage output from the loop filter 150, and generates and outputs a VCO output signal 170a, which is an RF signal with a high frequency corresponding to the input voltage. The RF signal output from the VCO 170 is input to the frequency divider 120.

The digital controller 110 delivers a division ratio signal 110a corresponding to the high-frequency RF signal to be output to the frequency divider 120. The division ratio signal 110a is indicated by a dotted line. The digital controller 110 may control operations of the frequency divider 120, the phase frequency detector 130, the charge pump 140, the loop filter 150, and the VCO input selector 160.

For example, when the signal synthesis apparatus 100 operates in a closed loop as a typical PLL circuit, the digital controller 110 performs a control operation so that the charge pump 140, the frequency divider 120, the phase frequency detector 130, etc. operate. In this instance, the digital controller 110 performs a control operation so that the VCO input selector 160 operates in a closed loop mode, and performs a control operation so that a voltage input to the VCO is stored in the energy storage unit 165.

Meanwhile, when the PLL circuit outputs a stable frequency signal after a certain period of time, the signal synthesis apparatus may operate in an open loop. The digital controller 110 may perform a control operation so that operations of the charge pump 140, the frequency divider 120, the phase frequency detector 130, etc. are suspended to save power. Instead, the digital controller 110 performs a control operation so that the VCO input selector 160 operates in an open loop mode, and performs a control operation so that a voltage is input to the input unit of the VCO using energy stored in the energy storage unit 165.

The frequency divider (Fractional N Divider) 120 lowers a frequency of the received high-frequency RF signal according to a division ratio in accordance with the division ratio signal 110a of the digital controller 110, and delivers the signal to the phase frequency detector 130.

The phase frequency detector 130 receives and compares a signal 130a and a reference clock signal 130b delivered from the frequency divider, and delivers a result in the form of a feedback pulse to the charge pump 140.

The charge pump CP 140 supplies or discharges a charge to the loop filter 150 according to the received feedback pulse.

The loop filter 150 includes an energy storage element such as a capacitor to accumulate a voltage using the charge input from the charge pump 140, and outputs the accumulated voltage as an input voltage of the VCO 170. The loop filter 150 may use two or more capacitors connected in parallel, and particularly serve as a low-pass filter by including a resistor between the capacitors.

The signal synthesis apparatus 100 may operate in a closed loop to generate a VCO output signal, which is a stable high-frequency RF signal, from the VCO. However, when a frequency of the VCO output signal output from the VCO is changed, it takes time for the changed frequency to stabilize in the PLL circuit, and thus there is a problem in that use for high-speed wireless communication, etc. using FSK is difficult.

Figure 1B:
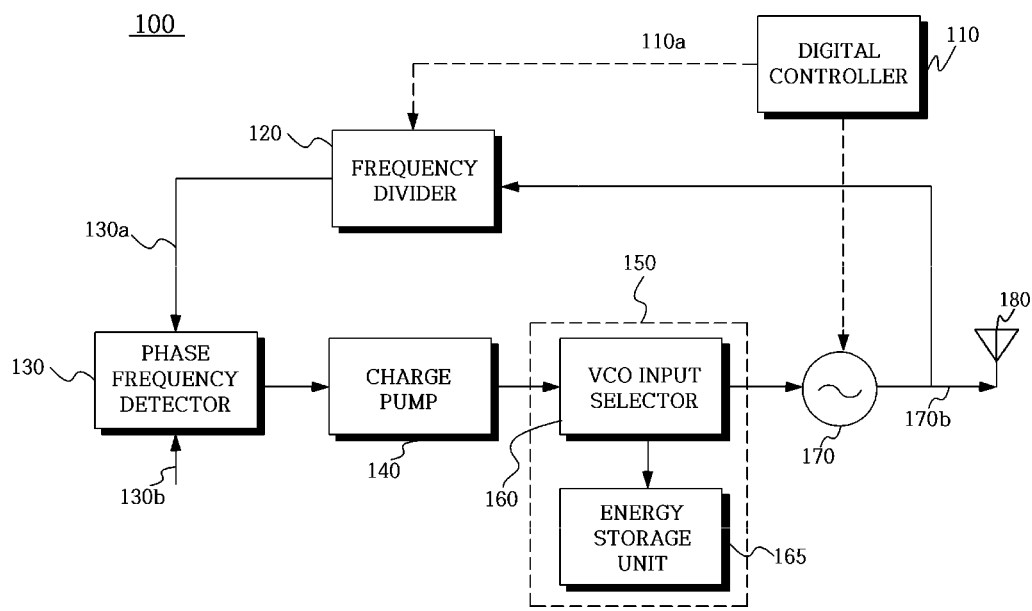

Referring to FIG. 1B, the signal synthesis apparatus 100 according to an embodiment may operate in a closed loop, and generate and output a high-speed FSK signal using 2-point modulation.

When a frequency corresponding to "0" of output data in the FSK signal is set to a first frequency, and a frequency corresponding to "1" thereof is set to a second frequency, the digital controller 110 delivers the division ratio signal 110a to the frequency divider 120 to output a VCO output signal 170b, which is an RF signal having a reference frequency that is an average frequency of the first frequency and the second frequency.

A charge output from the charge pump 140 is input to the loop filter 150, and a voltage is supplied to the input unit of the VCO through the VCO input selector 160. In this instance, energy may be stored in the energy storage unit 165 using the voltage supplied to the VCO input selector 160.

For fast frequency modulation of output data, the digital controller 110 delivers, to the VCO 170, a modulation control signal 110b indicated by a dotted line that changes a frequency by a difference between the reference frequency and the first frequency or the second frequency based on the output data. The VCO 170 receiving the modulation control signal 110b may change the reference frequency by a frequency according to the modulation control signal 110b to synthesize and output a VCO output signal 170b having the first frequency or the second frequency. A modification of setting the reference frequency to the first frequency or the second frequency is possible.

The antenna 180 is connected to a frequency signal output from the VCO 170 and wirelessly transmits the frequency signal.

The signal synthesis apparatus 100 according to an embodiment is used in a device that performs wired and wireless communication, and in particular, may be used in an IoT (Internet of Things) device that performs wireless RF communication through various high frequency bands. The signal synthesis apparatus 100 may be used in a wireless communication device of a wireless LAN (Wi-Fi), Bluetooth such as BLE (Bluetooth Low Energy), RFID, ZigBee, LoRa, etc. The signal synthesis apparatus 100 according to an embodiment of the present invention may transmit data to be output, preferably a high-frequency wireless signal according to an FSK wireless communication method.

The digital controller 110 according to an embodiment may include one or more processors and a memory configured to store instructions performed by the processors.

According to a modification, the digital controller 110 may include a digital logic.

Figure 2:
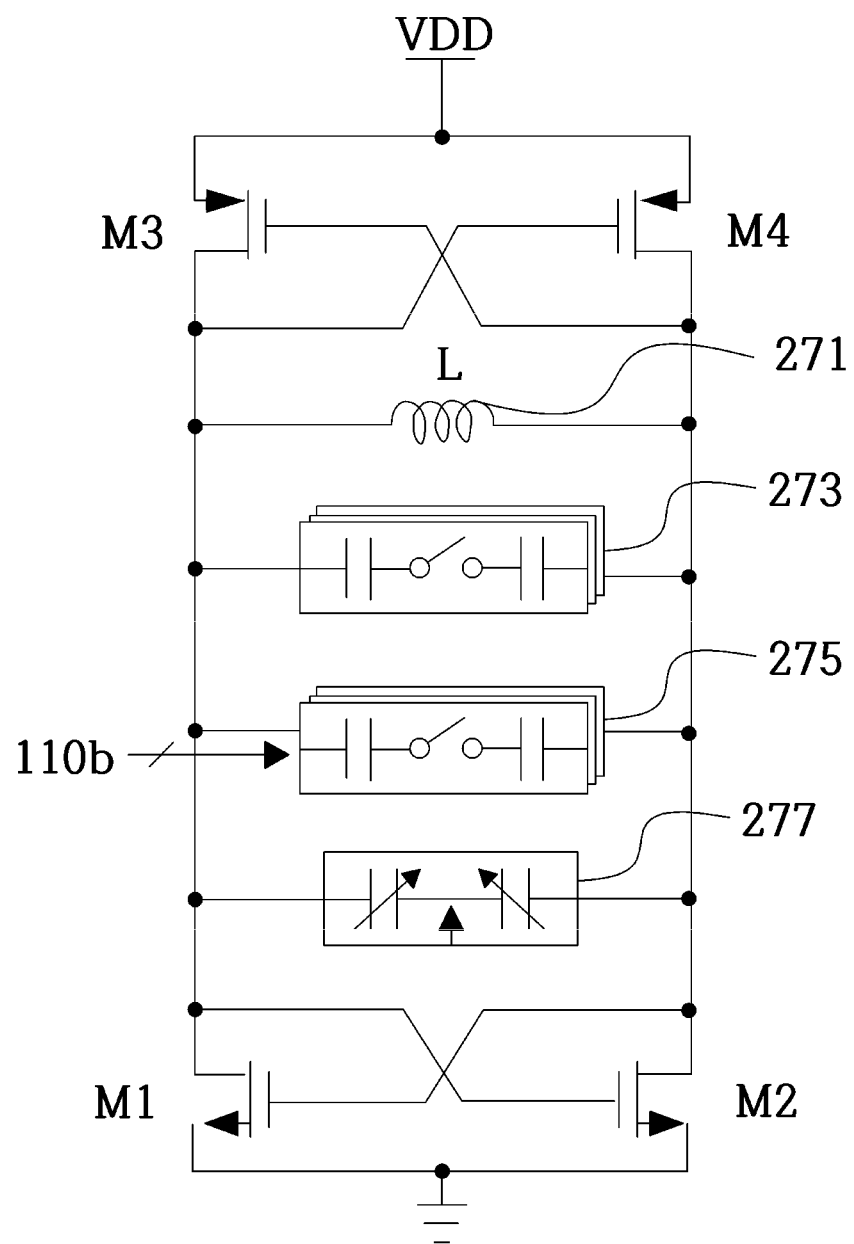
FIG. 2 is a configuration diagram illustrating a specific configuration of a VCO in the signal synthesis apparatus capable of correcting an offset of an open loop according to an embodiment.

FIG. 2 is a configuration diagram illustrating a specific configuration of the VCO in the signal synthesis apparatus capable of correcting an offset of an open loop according to an embodiment.

The VCO 170 includes a modulation cap bank 275. The modulation cap bank 275 includes capacitors controlled by a modulation control signal so that the capacitors are connected in parallel or open. The digital controller 110 transmits a modulation control signal to the VCO to obtain an output signal having a frequency modulated by the VCO. The VCO 170 may connect the capacitors of the modulation cap bank to the inductor according to the modulation control signal and output a VCO output signal having the modulated frequency.

According to an additional aspect, the VCO 170 further includes a frequency selection cap bank 273. The frequency selection cap bank 273 includes capacitors controlled by a frequency selection signal so that the capacitors are connected in parallel or open. The digital controller 110 transmits a frequency selection signal to the VCO to obtain an output signal having the reference frequency in the VCO. The VCO 170 may connect the capacitors of the frequency selection cap bank to the inductor according to the frequency selection signal and output a VCO output signal having the reference frequency.

According to an additional aspect, the VCO 170 may further include four MOSFETs M1, M2, M3, and M4, an inductor 271, and a varactor 277.

Among the four MOSFETs, two MOSFETs M3 and M4 are connected to a power supply VDD supplied to the signal synthesis apparatus, and the remaining two MOSFETs M1 and M2 are connected to ground GND.

The inductor 271 is used to generate a high-frequency signal in the VCO by resonating according to a capacitor connected to the varactor 277, the frequency selection cap bank 273, and the modulation cap bank 275.

The frequency selection cap bank 273 has a plurality of capacitors therein. The plurality of capacitors is each connected to the inductor 271 or open from the inductor 271 according to the frequency selection signal transmitted from the digital controller. The capacitors of the frequency selection cap bank connected to the inductor are configured to be connected in parallel with each other to the inductor.

In the frequency selection cap bank 273, capacitors connected in parallel or the number of capacitors is determined according to the frequency selection signal. The frequency selection cap bank 273 may include N capacitors, and each capacitor is connected to a switch. Each capacitor is connected to the inductor 271 or open under control according to the frequency selection signal. As an example, each bit in an N-bit frequency selection signal may control each capacitor. Each switch may be operated by the corresponding 1 bit of the frequency selection signal. In other words, a jth capacitor of the frequency selection cap bank may be configured to be connected to the inductor when a jth bit of the frequency selection signal is 1, and to be open with the inductor when the jth bit is 0. As a modification, two or three capacitors may be connected in series to one switch. As another modification, capacitors, the number of which is designated in the frequency selection signal, may be connected in parallel to the inductor.

A capacitance of each capacitor of the frequency selection cap bank 273 may be differently set. For example, a capacitance of a capacitor corresponding to an Nth bit of the frequency selection cap bank 273 may be configured to be twice as large as a capacitance of a capacitor corresponding to an (N−1)th bit. In this case, the capacitance of the capacitor corresponding to the Nth bit is $2^{N-1}$ times larger than a capacitance of a capacitor corresponding to the lowest bit (LSB). A wider range of capacitances may be selected by using capacitances that increase by a factor of 2, and a frequency error is determined according to the capacitance corresponding to the lowest bit.

The frequency selection cap bank 273 is used to set the reference frequency of the frequency signal output from the VCO 170 (for example, an intermediate frequency between two modulation frequencies output from the VCO).

The modulation cap bank 275 has a plurality of capacitors therein. The plurality of capacitors is each connected to the inductor 271 or open from the inductor 271 according to the modulation control signal 110b for 2-point modulation transmitted from the digital controller. The capacitors of the modulation cap bank connected to the inductor are configured to be connected in parallel with each other to the inductor.

In the modulation cap bank 275, capacitors connected in parallel or the number of capacitors is determined according to the modulation control signal. The modulation cap bank 275 may include M capacitors, and each capacitor is connected to a switch. Each capacitor is connected to the inductor 271 or open under control according to the modulation control signal 110b. As an example, each bit in an M-bit frequency selection signal may control each capacitor. Each switch may be operated by the corresponding 1 bit of the modulation control signal. In other words, an ith capacitor of the modulation cap bank may be configured to be connected to the inductor when an ith bit of the modulation control signal is 1, and to be open with the inductor when the ith bit is 0. As a modification, two or three capacitors may be connected in series to one switch. As another modification, capacitors, the number of which is designated in the modulation control signal, may be connected in parallel to the inductor.

Capacitances of capacitors respective of the modulation cap bank 275 may be set to be equal to each other. In the case where capacitors of the same capacitance are used, when a frequency change for one capacitor is determined in advance, it is possible to easily calculate the number of capacitors to be connected in parallel with the inductor to achieve a desired frequency change. In other words, the modulation control signal may be easily changed according to the number of capacitors to be connected in parallel with the inductor.

For example, the modulation cap bank 275 is used to set frequency shift (frequency deviation) (for example, +200 MHZ) for generation of a modulation frequency (for example, 1.8 GHZ and 2.2 GHZ) for a set reference frequency (for example, 2 GHZ) in FSK-type data communication.

The varactor 277 is a variable capacitance diode whose capacitance is variable depending on the voltage, and may change an oscillation frequency according to an input voltage.

The frequency of the VCO output signal output from the VCO 170 is determined based on the capacitance of the capacitors connected to the inductor 271 and the capacitance of the inductor 271. The frequency of the VCO output signal is inversely proportional to the inductance and capacitance inside the VCO. The VCO output signal may have a sine waveform. The VCO output signal may have a specific frequency depending on the capacitance of the connected capacitor and the capacitance of the inductor 271, and the frequency of the VCO output signal may be adjusted by controlling connection of the capacitors of the frequency selection cap bank and the modulation cap bank.

FIG. 3 is a circuit diagram illustrating a specific circuit of the loop filter in the signal synthesis apparatus capable of correcting an offset of an open loop according to an embodiment.

According to an additional aspect, the energy storage unit 165 includes an energy storage element 167 and a buffer 166. The energy storage element 167 is charged with an input voltage, and the buffer 166 is connected to an output unit of the energy storage element to maintain an output voltage of the energy storage element.

The loop filter 150 according to an embodiment may include the low-pass filter 155, the VCO input selector 160, and the energy storage unit 165.

The low-pass filter 155 flattens a voltage 140a delivered from the charge pump 140 and delivers the voltage 140a to the VCO input selector 160.

The VCO input selector 160 includes two switches S1 and S2 connected to the energy storage unit 165. An input switch S1 is connected to the input side of the energy storage unit, and an output switch S2 is connected to the output side thereof. The VCO input selector 160 selects one voltage among an input voltage delivered from the low-pass filter 155 and a voltage output from the energy storage unit and transmits the selected voltage to the input unit of the VCO.

The energy storage unit 165 includes the energy storage element 167 such as a capacitor C4. The energy storage element 167 is connected to the input switch S1 of the VCO input selector to be able to receive input of a voltage. Energy is stored from the input voltage, and the stored energy may be output in the form of a voltage through the output switch S2 of the VCO input selector 160. It is preferable to include the buffer 166 between the energy storage element and the input unit of the VCO to maintain a voltage output from the energy storage element. Therefore, the energy storage unit may include a capacitor 167 charged by an input voltage, and the buffer 166 connected to the output of the capacitor to maintain an output voltage of the capacitor. The energy storage unit 165 may generate an output voltage based on a voltage input to the energy storage unit and output the output voltage to the input unit of the VCO 170. The output voltage of the energy storage unit may have an offset compared to the input voltage by the buffer 166, the switch S2, etc.

Figure 3A:
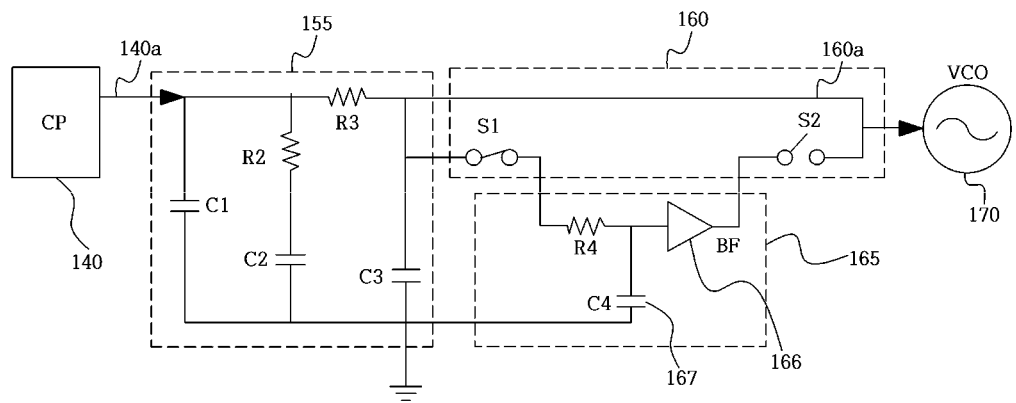
FIGS. 3A and 3B are circuit diagrams illustrating a specific circuit of a loop filter in the signal synthesis apparatus capable of correcting an offset of an open loop according to an embodiment.

FIG. 3A illustrates the case where the VCO input selector 160 operates in a closed loop mode. Referring to FIG. 3A, the voltage 140a delivered from the charge pump 140 is delivered to the VCO input selector 160 through the low-pass filter 155, and a voltage 160a is delivered to input unit of the VCO 170. Since the output switch S2 of the VCO input selector 160 is open, the input unit of the VCO is blocked from the output voltage of the energy storage unit 165. Meanwhile, since the input switch S1 of the VCO input selector 160 is closed, the energy storage unit 165 is connected in parallel with the VCO with respect to the voltage 160a delivered to the input unit of the VCO. As a result, the voltage 160a input to the VCO is supplied to the energy storage unit 165, and electricity energy is stored in the energy storage unit 167, for example, the capacitor C4.

Meanwhile, when the signal synthesis apparatus 100 is corrected, that is, when the frequency selection signal, the modulation control signal, etc. are determined to output an accurate frequency from the VCO, the reference voltage is supplied to the VCO to prevent fluctuation in input voltage. Therefore, during correction when the reference voltage is input, a voltage of the charge pump 140 is not delivered to the VCO 170 even when the VCO input selector 160 operates in a closed loop mode. To this end, during correction, the operation of the charge pump 140 is suspended or output of the charge pump 140 is blocked from the input unit of the VCO 170. The reference voltage may be obtained from a voltage VDD supplied to the signal synthesis apparatus. The reference voltage is ½ voltage (VDD/2), which is a voltage at which the charge pump 140 and the VCO 170 may operate most stably, and it is preferable to divide and use a supply voltage.

During correction, when the VCO input selector 160 operates in a closed loop mode, the input switch S1 of the VCO input selector 160 is closed, and thus the energy storage unit 165 is connected in parallel with the input unit of the VCO with reference to the reference voltage delivered to the input unit of the VCO. As a result, the reference voltage input to the VCO is supplied to the energy storage unit 165 and energy is stored.

Figure 3B:
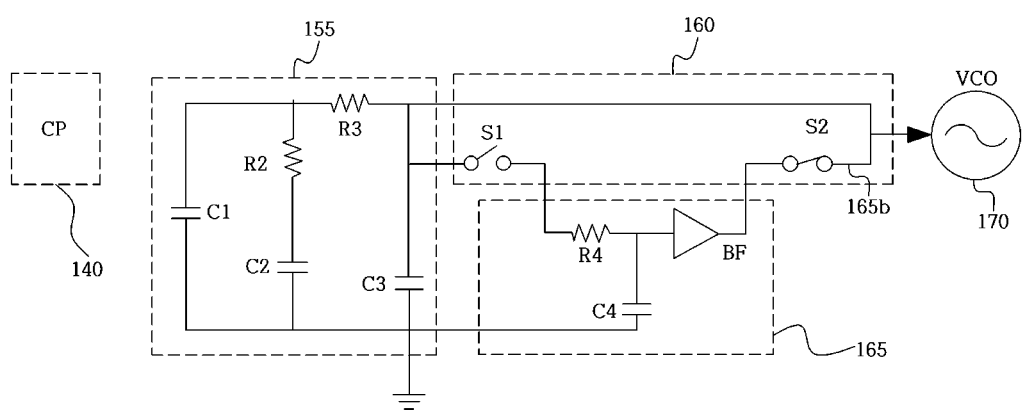

FIG. 3B illustrates the case where the VCO input selector 160 operates in an open loop mode. In the open loop mode, the input switch S1 of the VCO input selector 160 is open, and thus the energy storage unit 165 is blocked from the low-pass filter 155. Meanwhile, the output switch S2 of the VCO input selector 160 is closed, and thus the output of the energy storage unit 165 is connected in series with the input unit of the VCO. Therefore, a voltage of the energy storage element 167 is delivered to the input unit of the VCO 170. In this instance, the energy storage unit 165 outputs a voltage 165b to the input unit of the VCO based on the stored energy.

When the VCO input selector 160 operates in the open loop mode, output of the energy storage unit 165 is supplied to the input unit of the VCO 170, and thus a voltage of the charge pump 140 is prevented from being delivered to the VCO 170 in the open loop mode. To this end, the operation of the charge pump 140 is suspended, or the output of the charge pump 140 is blocked from the input unit of the VCO 170. In an embodiment of the present invention, in order to save power, when the frequency is stable, the operations of the charge pump 140, the frequency divider 120, the phase frequency detector 130, etc. are suspended to operate the signal synthesis device 100 in the open loop, and the VCO input selector 160 is operated in the open loop mode to deliver the voltage of the energy storage unit 165 to the input unit of the VCO.

For example, as shown in FIG. 3A, the capacitor C4, which is the energy storage element 167 of the energy storage unit 165, is charged with an input voltage during the closed loop mode. When the VCO input selector 160 is switched to the open loop mode as shown in FIG. 3B, the capacitor C4 of the energy storage unit 165 outputs the charged voltage to the VCO 170. Since the voltage output from the capacitor C4, which is the energy storage element 167, is supplied to the input unit of the VCO through the buffer 166, the output switch S2, etc., the voltage 165b supplied to the input unit of the VCO may have a difference from a voltage output from the capacitor C4, which is the energy storage element 167, or a voltage output from the energy storage unit 165.

Figure 4:
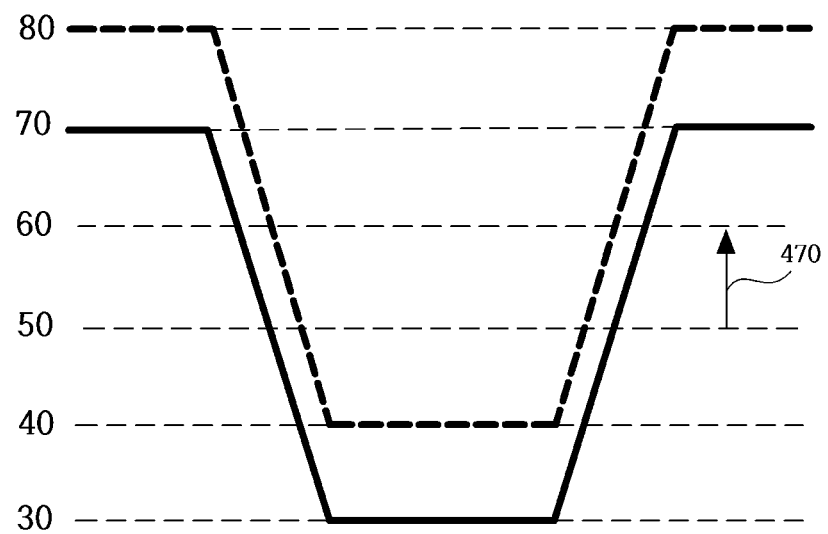
FIG. 4 is a conceptual diagram illustrating the number of connected capacitors in a modulation cap bank according to a frequency offset in the signal synthesis apparatus capable of correcting an offset of an open loop according to an embodiment.

FIG. 4 is a conceptual diagram illustrating the number of connected capacitors in the modulation cap bank according to a frequency offset in the signal synthesis apparatus capable of correcting an offset of an open loop according to an embodiment.

In FIG. 4, a thick solid line indicates the number of capacitors in the modulation cap bank for outputting the VCO output signal having a modulated frequency in a closed-circuit mode. Referring to FIG. 4, the number of capacitors in the modulation cap bank that outputs the reference frequency in the closed-circuit mode is 50, and the number of capacitors in the modulation cap bank in the closed-circuit mode is ±20 (30 to 70) to obtain a predetermined modulation frequency for the modulated frequency.

In the case of switching to an open loop mode, when the frequency of the VCO output signal increases by a frequency corresponding to 10 capacitors of the modulation cap bank, correction is made by increasing the number of capacitors in the modulation cap bank in the closed loop mode by 10 as indicated by an arrow 470 to compensate therefor. A result of this correction is indicated by a thick dotted line in FIG. 4. In other words, when the modulation control signal is transmitted to the VCO to change the number of capacitors in the modulation cap bank between 40 and 80, a predetermined modulation frequency may be obtained during design from the VCO output signal.

Figure 5:
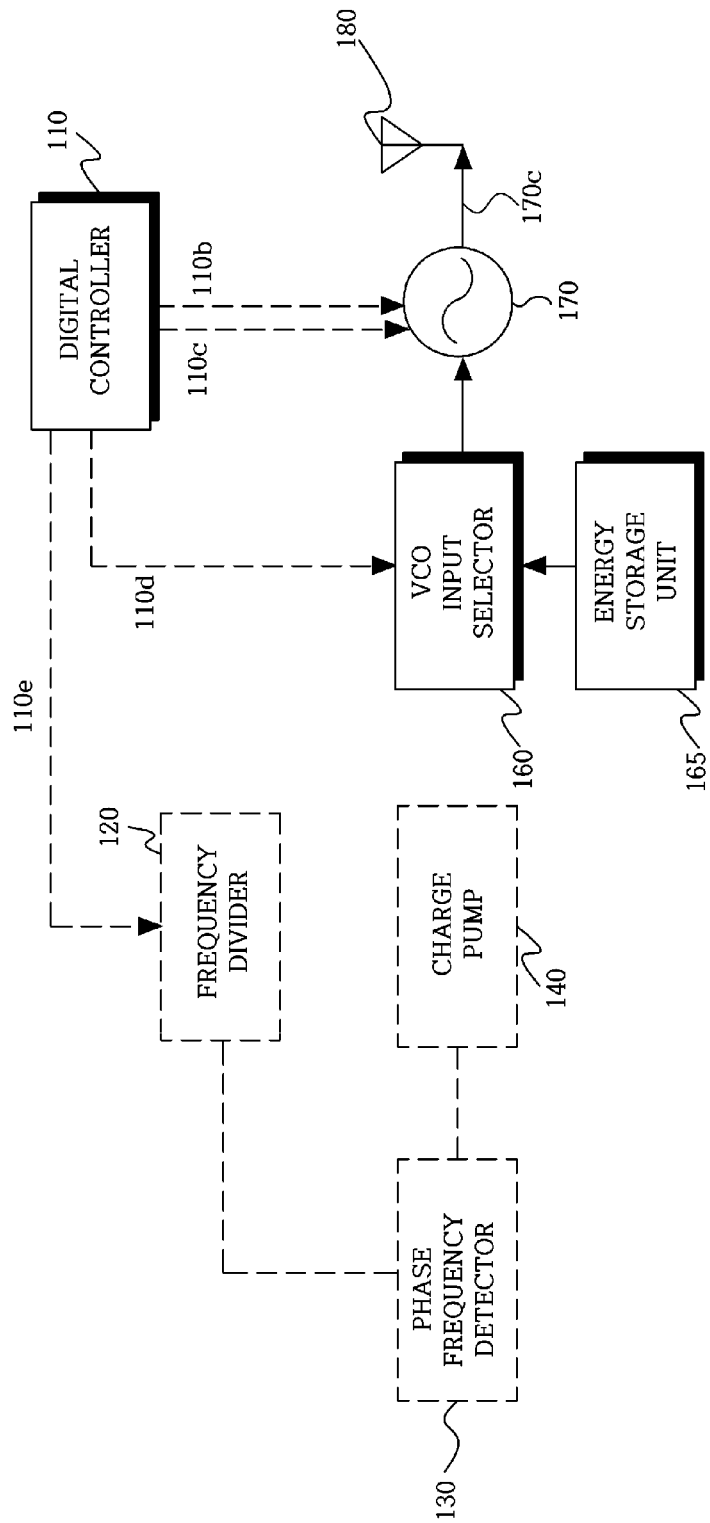
FIG. 5 is a schematic configuration diagram for describing that the signal synthesis apparatus capable of correcting an offset of an open loop operates in the open loop according to an embodiment.

FIG. 5 is a schematic configuration diagram for describing that the signal synthesis apparatus capable of correcting an offset of an open loop operates in the open loop according to an embodiment.

According to an embodiment, the digital controller 110 may operate the signal synthesis apparatus 100 in the open loop to save power of the signal synthesis apparatus 100 that operates in the closed loop as shown in FIG. 1. To this end, a control signal 110e is transmitted to suspend operations to the frequency divider 120, the phase frequency detector 130, the charge pump 140, etc. In this instance, the digital controller 110 may transmit a control signal 110d so that the VCO input selector 160 operates in the open loop mode.

The digital controller 110 transmits a frequency selection signal 110c to the VCO in advance so that the signal synthesis apparatus operates in a reference frequency domain.

The digital controller 110 generates a modulation control signal 110b according to data to be output to the outside and transmits the signal to the VCO 170. The VCO 170 generates a VCO output signal 170c modulated at the reference frequency according to the modulation control signal 110b input from the digital controller 110, and the generated signal may be transmitted to an external base station or AP using the output antenna 180.

While the VCO input selector 160 operates in the closed loop mode, energy stored in the energy storage unit 165 is used to supply a voltage to the VCO 170 in the open loop mode. The VCO 170 may output an RF signal having the reference frequency using the voltage input from the energy storage unit.

As the operation of the signal synthesis apparatus 100 changes from the closed loop to the open loop, the operation mode of the VCO input selector 160 changes from the closed loop mode to the open loop mode. In this instance, a voltage input to the VCO changes from a voltage supplied in the closed loop to a voltage output from the energy storage unit. A voltage output from the energy storage unit and input to the VCO in the open loop is different from a voltage input to the VCO in the closed loop due to a buffer, a switch, etc. In order to obtain a VCO output signal having the same frequency in the open loop as that in the closed loop, an offset need to be corrected for a voltage output from the energy storage unit in the open loop.

To measure a frequency offset by a difference between the frequency of the VCO output signal in the open loop and the frequency of the VCO output signal in the closed loop, and correct this frequency offset, the digital controller 110 transmits the modulation control signal 110b to the VCO 170. The VCO 170 adjusts the frequency of the output signal of the VCO 170 by connecting capacitors of the modulation cap bank in parallel according to the modulation control signal 110b. The digital controller 110 determines the modulation control signal 110b so that the same frequency as the frequency of the VCO output signal in the closed loop is output in the open loop.

The signal synthesis apparatus 100 according to an embodiment may save power by operating in the open loop in which the operations of the frequency divider 120, the phase frequency detector 130, the charge pump 140, etc. are suspended when data is output, output an accurate high-frequency signal by supplying a voltage stored in the energy storage unit to the VCO and compensating for an offset voltage, and perform fast and accurate frequency modulation according to the modulation control signal. Therefore, the signal synthesis apparatus according to an embodiment may be usefully used in an IoT device that requires low-power and high-speed operation.

Figure 6:
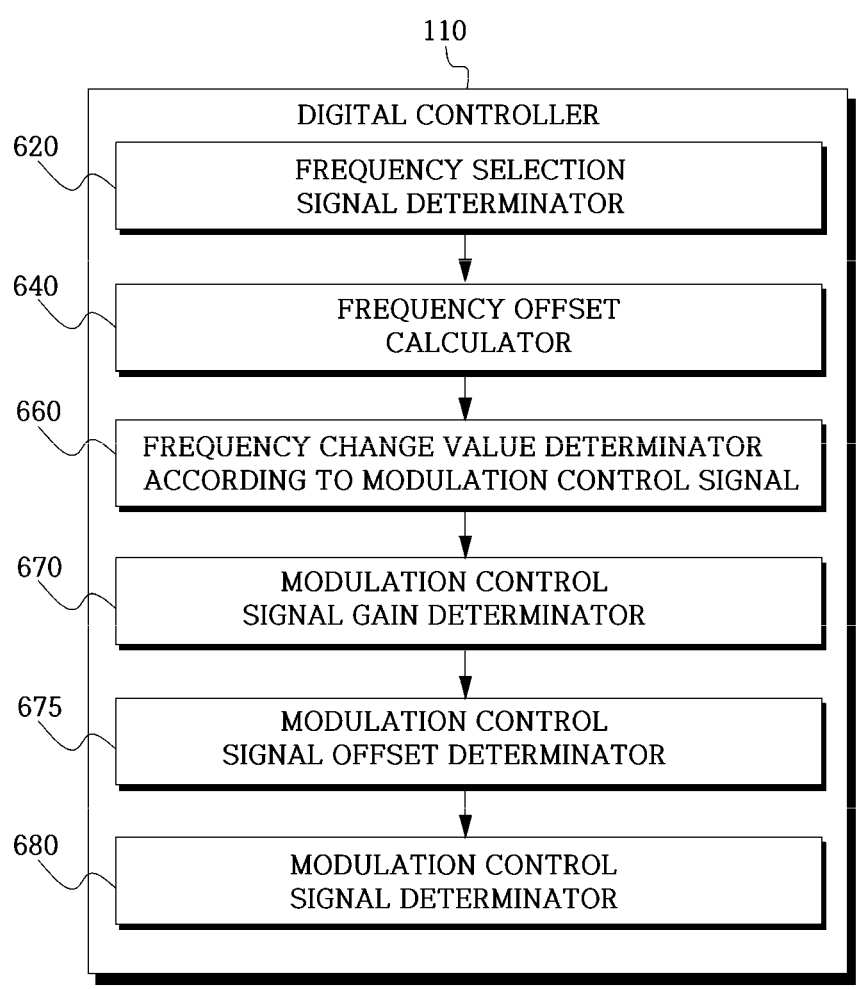
FIG. 6 is a configuration diagram illustrating a specific configuration of a digital controller in the signal synthesis apparatus capable of correcting an offset of an open loop according to an embodiment.

FIG. 6 is a configuration diagram illustrating a specific configuration of the digital controller in the signal synthesis apparatus capable of correcting an offset of an open loop according to an embodiment.

According to an additional aspect, digital controller 110 further includes a frequency selection signal determinator 620. The frequency selection signal determinator 620 generates a frequency selection signal, transmits the frequency selection signal to the VCO, and changes the frequency selection signal based on a result of comparing a measured frequency of the VCO output signal with a predetermined reference frequency.

For a reason such as change of capacitance according to a chip manufacturing process or usage environment, it is necessary to determine the frequency selection signal before using the signal synthesis apparatus 100. To determine the frequency selection signal, the digital controller 110 first suspends operation of the charge pump 140 and supplies a reference voltage to the input unit of the VCO. The frequency selection signal determinator 620 of the digital controller 110 generates a frequency selection signal for connecting a largest capacitor in the frequency selection cap bank 273, transmits the frequency selection signal to the VCO, and additionally changes the frequency selection signal based on a result of comparing a measured frequency of the VCO output signal with a predetermined reference frequency. The frequency selection signal may change the frequency of the VCO output signal by performing a control operation so that the capacitors of the frequency cap bank 273 are connected in parallel with the inductor. To perform correction on change of the frequency of the VCO output signal depending on the temperature and humidity of the usage environment, the frequency selection signal is changed, and a frequency selection signal is determined so that the frequency of the VCO output signal is close to the reference frequency.

For example, when the areas of the capacitors included in the frequency selection cap bank 273 are configured to each increase by two times, the capacitance of the second capacitor is twice that of the first capacitor, and the capacitance of the third capacitor is twice that of the second capacitor or four times that of the first capacitor. The digital controller may control each bit of the frequency selection signal so that each capacitor of the frequency selection cap bank 273 is connected in parallel with the inductor or open. In this instance, the most significant bit (MSB) of the frequency selection signal may be set to control the capacitor having the largest capacitance, and the least significant bit (LSB) may be set to control the capacitor having the smallest capacitance.

In this case, each bit of the frequency selection signal is changed from the MSB to the LSB, and the frequency of the VCO output signal is measured. When the measured frequency is close to the reference frequency within an error range, change of the frequency selection signal may be terminated. The error range may be set by a frequency change caused by the smallest capacitor.

For example, when the frequency selection signal is an 8-bit signal corresponding to 8 capacitors, a signal such as "1000 0000" is output and a frequency is measured by setting only the MSB of the frequency selection signal to "1" and setting the other bits to "0" so that only the capacitor having the largest capacitance in the frequency selection cap bank 273 is initially connected. When the measured frequency is greater than the reference frequency and an additional capacitor is connected to lower the frequency, the second bit is set to "1" to output a signal such as "1100 0000" and measure the frequency. When the measured frequency for this frequency selection signal is less than the reference frequency, the capacitance value is lowered to increase the frequency. To this end, a signal such as "1010 0000" is output and a frequency is measured by setting the second bit to "0" and setting the third bit to "1" so that the existing capacitor is open and the subsequent capacitor is connected. By repeating this process, it is possible to determine a frequency selection signal for outputting a VCO output signal close to the reference frequency.

According to an additional aspect, the digital controller 110 includes a frequency offset calculator 640 and a modulation control signal offset determinator 675.

The frequency offset calculator 640 calculates a frequency offset based on a difference between a closed loop mode frequency of the VCO output signal output from the VCO when the VCO input selector operates in the closed loop mode and an open loop mode frequency of the VCO output signal output from the VCO when the VCO input selector operates in the open loop mode. A method of calculating the frequency offset will be described later using FIG. 7.

The modulation control signal offset determinator 675 determines an offset of the modulation control signal to compensate for the frequency offset based on a frequency change value according to a predetermined modulation control signal.

According to a modification, the modulation control signal offset determinator 675 may determine an offset of the modulation control signal to compensate for the frequency offset based on a predetermined frequency change value per capacitor of the modulation cap bank.

For example, a description will be given of the case where the frequency change per capacitor of the modulation cap bank or the frequency change for the modulation control signal for connecting one capacitor of the modulation cap bank is 2 MHz and the frequency offset is 16 MHZ. Since 16/2=8, the offset of the modulation control signal may be determined to be 8. Therefore, to correct the frequency offset, a signal for connecting eight more capacitors than the number of capacitors in the modulation cap bank determined by a design value may be determined as a corrected modulation control signal.

According to an additional aspect, the digital controller 110 further includes a frequency change value determinator 660 according to the modulation control signal. The frequency change value determinator 660 according to the modulation control signal determines a frequency change value according to the modulation control signal based on a difference between frequencies of VCO output signals each measured for each of the plurality of modulation control signals transmitted to the VCO.

According to a modification, the frequency change value determinator 660 according to the modulation control signal may determine a frequency change value per capacitor of the modulation cap bank.

To determine the modulation control signal, the digital controller 110 first suspends the operation of the charge pump 140 and supplies the reference voltage to the VCO input.

The frequency change value determinator 660 transmits a first modulation control signal to the VCO 170 according to the modulation control signal of the digital controller 110. According to the first modulation control signal, a connection state of the capacitors of the modulation cap bank 275 changes, and the frequency of the VCO output signal changes. The digital controller 110 measures a first modulation frequency of the VCO output signal. The frequency change value determinator 660 according to the modulation control signal transmits a second modulation control signal to the VCO 170 and measures a second modulation frequency of the VCO output signal. A frequency change value according to the modulation control signal may be determined from the first modulation frequency for the first modulation control signal and the second modulation frequency for the second modulation control signal.

For example, a description will be given of the case where m capacitors of the modulation cap bank 275 are connected in parallel to output the frequency-modulated first modulation frequency, and to this end, the first modulation control signal is designed to be used, and n capacitors of the modulation cap bank 275 are connected in parallel to output the frequency-modulated second modulation frequency, and to this end, the second modulation control signal is designed to be used. In this case, a design value of the frequency change per capacitor of the designed modulation cap bank corresponds to (first frequency−second frequency)/(m−n). Due to variations in the manufacturing process of an IC chip included in the frequency signal synthesis apparatus, when the first modulation control signal is input to the VCO, the frequency of the VCO output signal may be a third modulation frequency different from the first modulation frequency, which is the design frequency, and when the second modulation control signal is input to the VCO, the frequency of the VCO output signal may be a fourth modulation frequency different from the second modulation frequency, which is the design frequency. The frequency change value per capacitor of the modulation cap bank 275 may be determined using a difference between the third modulation frequency and the fourth modulation frequency and a difference between the number of connected capacitors according to the first modulation control signal and the number of connected capacitors according to the second modulation control signal. That is, the frequency change value per capacitor of the modulation cap bank may be determined by an equation (third modulation frequency−fourth modulation frequency)/(m−n).

For example, when the first modulation control signal is a signal for connecting 10 capacitors and the second modulation control signal is a signal for connecting 15 capacitors, if the difference between the first modulation frequency and the second modulation frequency is 10 MHZ, a frequency difference per capacitor is 10 MHz/(15-10)=2 MHz. In other words, a frequency change value according to a modulation control signal for connecting one more capacitor is 2 MHz. The frequency change value according to the modulation control signal may be determined and stored in advance.

The frequency modulation control gain may be determined using the frequency change value according to the predetermined modulation control signal, and a modulation control signal for compensating therefor may be determined.

According to an additional aspect, the digital controller 110 further includes a modulation control signal gain determinator 670. The modulation control signal gain determinator 670 determines the gain of the modulation control signal by comparing the frequency change value according to the modulation control signal with the design value.

For example, in the previous example, the gain of the modulation control signal may be determined using an equation such as (first modulation frequency-second modulation frequency)/(third modulation frequency-fourth modulation frequency).

According to a modification, the modulation control signal gain determinator 670 may determine the gain of the modulation control signal by comparing the frequency change value per capacitor of the modulation cap bank with the design value.

According to an additional aspect, the digital controller 110 further includes a modulation control signal determinator 680. The modulation control signal determinator 680 determines a modulation control signal required for frequency modulation of output data by applying the gain of the modulation control signal and the offset of the modulation control signal to a predetermined design value of the modulation control signal.

According to a modification, the modulation control signal determinator 680 determines a modulation control signal required for frequency modulation of output data by multiplying a design value of the number of connected capacitors of the modulation cap bank according to the modulation control signal by the gain of the modulation control signal.

According to a modification, the modulation control signal determinator 680 determines a modulation control signal required for frequency modulation of output data by adding an offset of the modulation control signal to a design value of the number of connected capacitors of the modulation cap bank according to the modulation control signal.

According to a modification, the modulation control signal determinator 680 may include the modulation control signal gain determinator 670.

A method of controlling the digital controller 110 will be further described below using flowcharts of FIG. 10.

FIG. 7 is a schematic configuration diagram for describing an operation of calculating a frequency offset in the signal synthesis apparatus capable of correcting an offset of an open loop according to an embodiment.

According to an additional aspect, the signal synthesis apparatus further includes a counter 795 configured to measure the number of peaks of the VCO output signal.

According to an additional aspect, the digital controller 110 determines a frequency of the VCO output signal using the number of peaks measured by the counter and a measurement time.

According to a modification, the digital controller 110 may include the counter 795.

According to an additional aspect, the signal synthesis apparatus further includes a reference voltage generator 790 configured to output a predetermined constant reference voltage to the input unit of the VCO.

According to an additional aspect, the VCO input selector 160 connects output of the reference voltage generator 790 in series with the input unit of the VCO to input an output voltage of the reference voltage generator to the VCO.

In the case of correction using the reference voltage, the digital controller 110 suspends an operation of the charge pump 140 to block an input loop voltage.

Figure 7A:
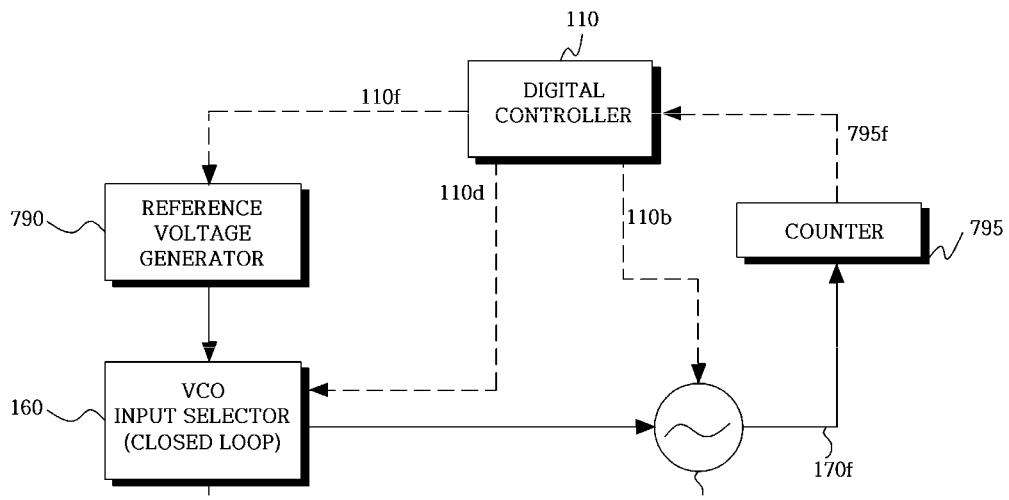
FIGS. 7A and 7B are schematic configuration diagrams for describing an operation of calculating a frequency offset in the signal synthesis apparatus capable of correcting an offset of an open loop according to an embodiment.

FIG. 7A is a configuration diagram illustrating an operating state of the signal synthesis apparatus 100 for determining a closed loop mode frequency. The digital controller 110 operates the reference voltage generator 790 (110*f*) and suspends the operation of the charge pump 140. The VCO input selector 160 performs a control operation to operate in the closed loop mode (110*d*). A frequency of the closed loop mode may be determined by receiving a frequency measurement result of a VCO output signal 170*f* using the counter 795 (795*f*).

According to a modification, the digital controller 110 may transmit the modulation control signal 110*b* to the VCO 170. In this instance, an uncorrected design value is transmitted as the transmitted modulation control signal.

According to a modification, the digital controller 110 may transmit a frequency control signal to the VCO 170 together with or separately from the modulation control signal 110*b*.

Figure 7B:
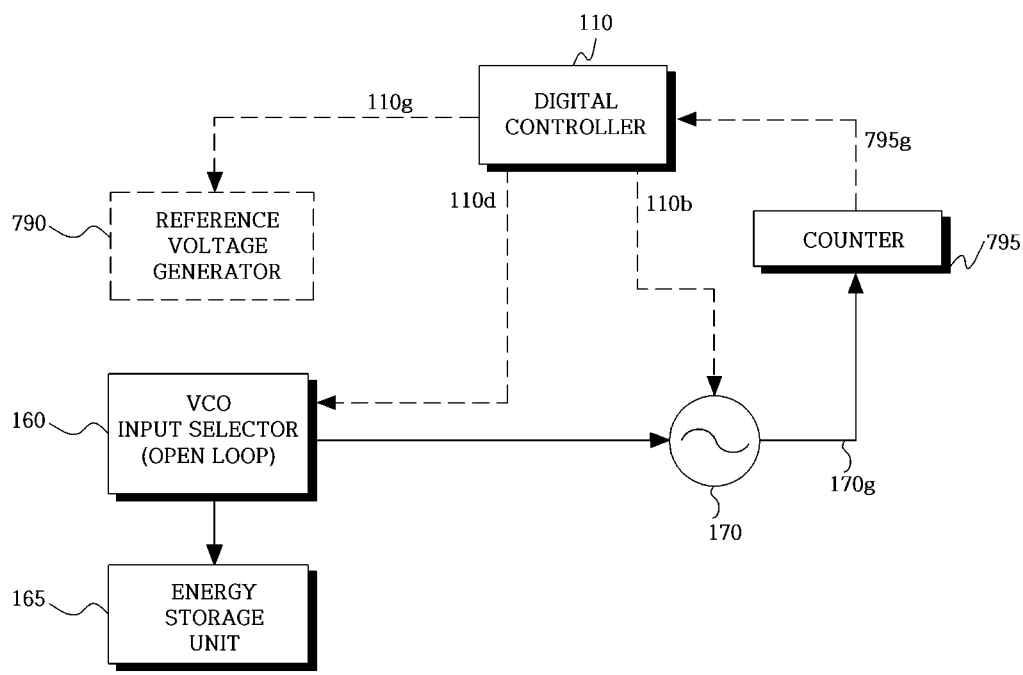

FIG. 7B is a configuration diagram illustrating an operating state of the signal synthesis apparatus 100 for determining an open loop mode frequency. The digital controller 110 performs a control operation to suspend the operation of the reference voltage generator 790 (110*g*), and operate the VCO input selector 160 in the open loop mode (110*d*). A frequency of the open loop mode may be determined by receiving input of a frequency measurement result of an VCO output signal 170*g* using the counter 795 (795*g*).

A frequency offset may be calculated using a difference between the frequency of the closed loop mode obtained in FIG. 7A and the frequency of the open loop mode obtained in FIG. 7B.

FIG. 8 is a graph illustrating an example of a modulation control signal and an output frequency before correction in the signal synthesis apparatus capable of correcting an offset of an open loop according to an embodiment.

Figure 8A:
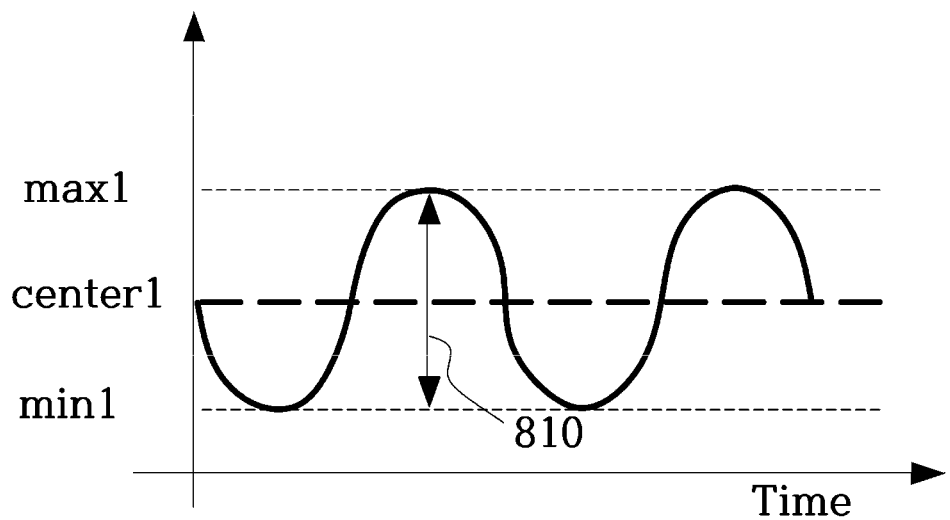
FIGS. 8A and 8B are graphs illustrating an example of a modulation control signal and an output frequency before correction in the signal synthesis apparatus capable of correcting an offset of an open loop according to an embodiment.

FIG. 8A is an example illustrating a modulation control signal according to a design value output from the digital controller over time. A horizontal axis is a time axis, and a vertical axis corresponds to the number of bits of the modulation control signal or the number of capacitors connected in the modulation cap bank by the modulation control signal. Since rapid changes in the modulation control signal may cause distortion of the VCO output signal, the modulation control signal is smoothly changed. When output data is "0101," a modulation control signal in the form of a sine wave may be output. A modulation control signal (bit) corresponding to the (number of) capacitors designed to output the reference frequency corresponds to center1, a modulation control signal corresponding to a capacitor for outputting a modulated first frequency corresponds to min1, and a modulation control signal corresponding to a capacitor for outputting a modulated second frequency corresponds to max1. A design value range of a modulation control signal corresponding to the number of capacitors, connection of which is changed by the modulation control signal for frequency modulation, is indicated by an arrow 810.

Figure 8B:
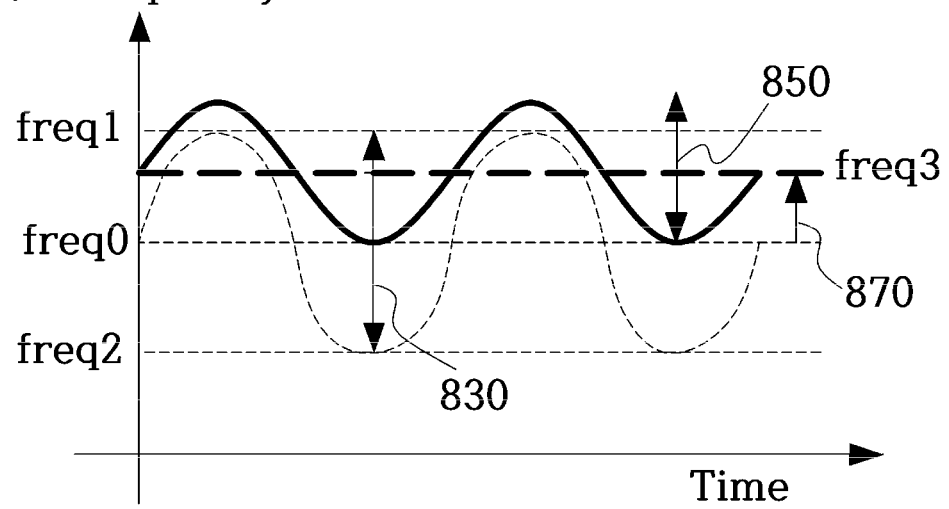

FIG. 8B is an example illustrating a frequency of a VCO output signal output by the VCO operating in the open loop mode receiving a modulation control signal according to a design value over time. A frequency indicated by a dotted line represents a frequency of an ideal VCO output signal in a closed loop according to the design, centered on a reference frequency freq0 and having a first frequency freq1 and a second frequency freq2. A frequency range of the ideal VCO output signal corresponding to a design value range 810 of the modulation control signal is indicated by an arrow 830. A frequency indicated by a thick solid line represents an example of a VCO output signal measured in the open loop. Depending on the temperature and humidity environment or the manufacturing process, a frequency width 850 varies from the design value 830, and a frequency center value freq3 changes from the design value freq0 due to an open loop offset, so that a frequency offset 870 is generated.

FIG. 9 is a graph illustrating an example of a modulation control signal and an output frequency after correction in the signal synthesis apparatus capable of correcting an offset of an open loop according to an embodiment.

Figure 9A:
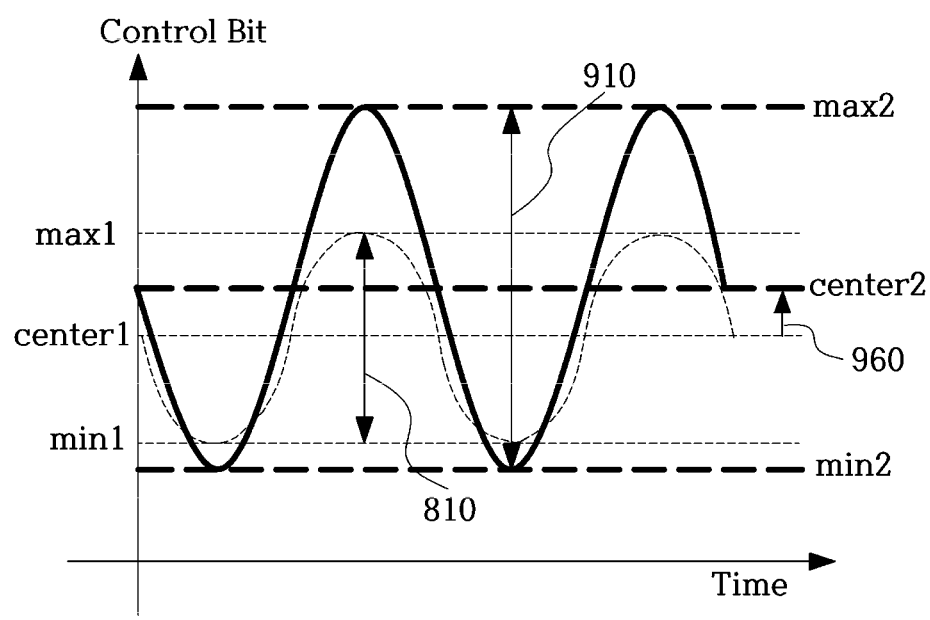
FIGS. 9A and 9B are graphs illustrating an example of a modulation control signal and an output frequency after correction in the signal synthesis apparatus capable of correcting an offset of an open loop according to an embodiment.

FIG. 9A is an example illustrating a corrected modulation control signal output from the digital controller over time. A dotted line represents a design value for the closed loop mode, and a thick solid line represents a modulation control signal corrected for the open loop mode.

When the frequency width 850 is reduced as shown in FIG. 8B, it is necessary to connect more capacitors of the modulation cap bank to increase the frequency range (min2 and max2). Therefore, a frequency range 930 expected from the design value may be output by transmitting a modulation signal having a larger range 910 than the design value range 810 to the VCO. To this end, the digital controller transmits, to the VCO, a modulation control signal obtained by applying the gain of the modulation control signal to the design value of the modulation control signal. When the connection state of the capacitors of the modulation cap bank is adjusted by the modulation control signal, the VCO may output a VCO output signal having modulation frequencies in the range expected at design.

In order to compensate for the frequency offset 870 in which the center frequency freq3 of the VCO output signal is higher than the reference frequency freq0 according to the design, more capacitors of the modulation cap bank need to be connected. To this end, the digital controller 110 transmits, to the VCO, a modulation control signal obtained by applying an offset 960 of the modulation control signal to the design value of the modulation control signal. As a result, the center frequency after correction may be equal to the design value freq0 since a frequency offset 970 is compensated in the measured value freq3 of the center frequency before correction.

Figure 9B:
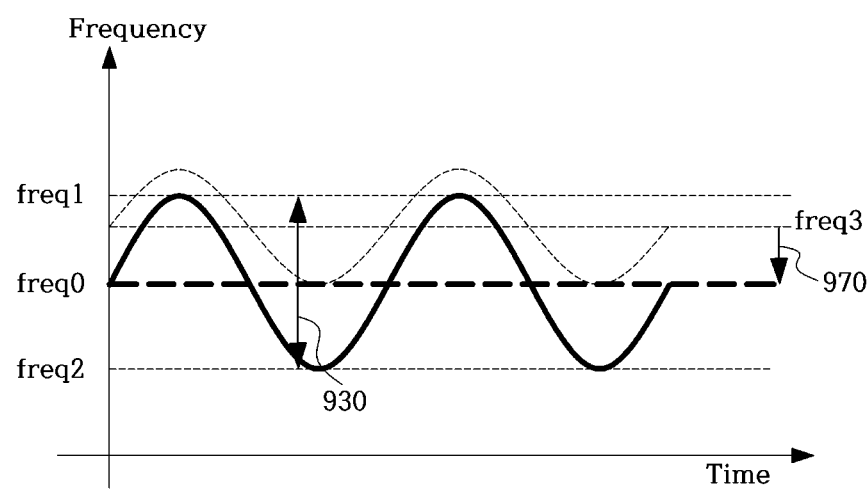

FIG. 9B is an example illustrating a frequency of the VCO output signal output from the VCO operating in the open loop mode that receives a corrected modulation control signal over time. A frequency before correction is indicated by a dotted line, and a frequency after correction is indicated by a thick solid line. When a modulation control signal corrected by applying the gain of the modulation control signal together with the offset of the modulation control signal is transmitted from the digital controller to the VCO, a frequency-modulated signal including the designed modulation frequencies freq1 and freq2 may be stably output even in the open loop.

Hereinafter, a signal synthesis method performed by the signal synthesis apparatus 100 described so far will be examined mainly focusing on an operation performed by the digital controller 110. An omitted part for content overlapping the previously described content may be understood with reference to the previous description.

Figure 10:
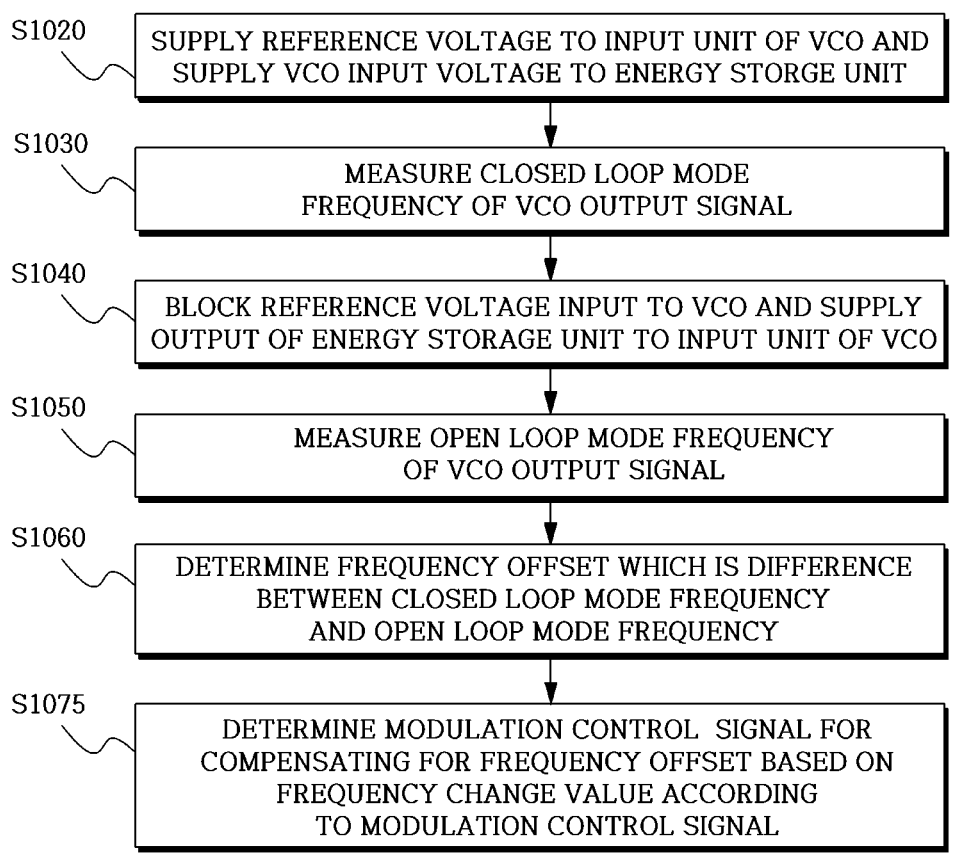
FIG. 10 is a flowchart illustrating a method of determining an offset of a modulation control signal for compensating for a frequency offset in a signal synthesis method capable of correcting an offset of an open loop according to an embodiment.

FIG. 10 is a flowchart illustrating a method of determining an offset of a modulation control signal for compensating for a frequency offset in the signal synthesis apparatus capable of correcting an offset of an open loop according to an embodiment.

According to another aspect of the proposed invention, a signal synthesis method of outputting a frequency-modulated signal by correcting an offset between a closed loop and an open loop includes a step S1020 of supplying a reference voltage to the input unit of the VCO and setting a closed loop mode in which input of the energy storage unit is connected to the input unit of the VCO to supply the reference voltage input to the VCO to the energy storage unit, a step S1030 of measuring a frequency of a VCO output signal output from the VCO to determine a closed loop mode frequency, a step S1040 of blocking supply of the reference voltage input to the VCO and switching to an open loop mode in which output of the energy storage unit is connected to the input unit of the VCO to supply an output voltage of the energy storage unit to the input unit of the VCO, a step S1050 of measuring a frequency of the VCO output signal to determine an open loop mode frequency, a step S1060 of calculating a frequency offset based on a difference from the closed loop mode frequency, and a step S1075 of determining an offset of the modulation control signal to compensate for the frequency offset based on a frequency change value according to the modulation control signal for adjusting a connection state of the capacitors of the modulation cap bank.

According to a modification, the signal synthesis method may further include a step of transmitting a predetermined frequency selection signal to the VCO before performing the steps of determining the modulation control signal.

According to a modification, the signal synthesis method may further include a step S1360 of determining a frequency selection signal before performing the steps of determining the modulation control signal, which will be additionally described with reference to FIG. 13.

Figure 11:
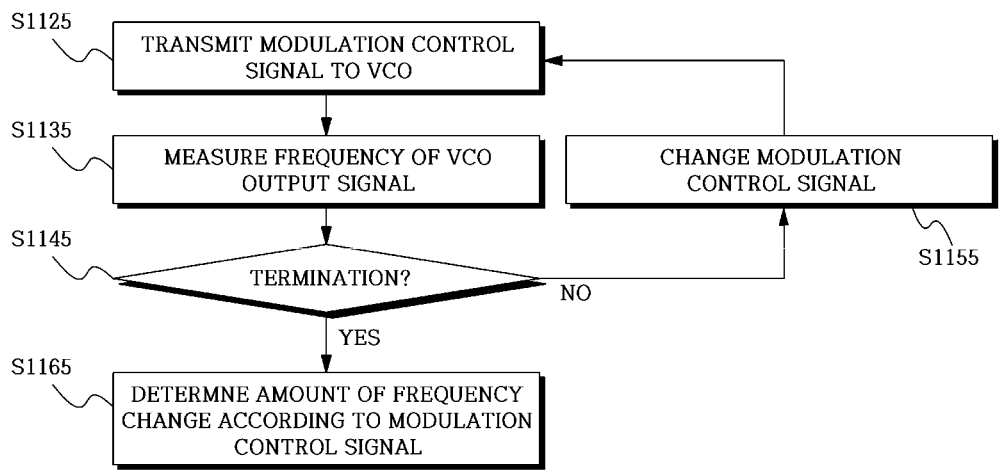
FIG. 11 is a flowchart illustrating a method of determining a frequency change value according to a modulation control signal in the signal synthesis method capable of correcting an offset of an open loop according to an embodiment.

FIG. 11 is a flowchart illustrating a method of determining a frequency change value according to a modulation control signal in a signal synthesis method capable of correcting an offset of an open loop according to an embodiment.

According to an additional aspect, the signal synthesis method further includes a step of generating a first modulation control signal and transmitting the first modulation control signal to the VCO (S1125) and measuring a first modulation frequency of a VCO output signal (S1135), a step of generating a second modulation control signal (S1155), transmitting the second modulation control signal to the VCO (S1125), and measuring a second modulation frequency of the VCO output signal (S1135), and a step of determining a frequency change value according to a modulation control signal based on a difference between the first modulation frequency and the second modulation frequency (S1165).

According to a modification, the signal synthesis method further includes a step S1020 of supplying a reference voltage to the input unit of the VCO, and setting an operation mode of the VCO input selector to the closed loop mode to connect input of the energy storage unit to the input unit of the VCO, thereby supplying the reference voltage input to the VCO to the energy storage unit.

According to a modification, the signal synthesis method may further include a step of transmitting a predetermined frequency selection signal to the VCO before performing the steps of determining the modulation control signal.

According to a modification, the signal synthesis method may further include a step S1360 of determining a frequency selection signal before performing the steps of determining the modulation control signal, which will be additionally described with reference to FIG. 13.

According to an embodiment, the method of determining a frequency change value according to a modulation control signal using a reference voltage may be performed as follows.

The digital controller transmits a modulation control signal to the VCO (S1125). The modulation control signal may be configured as a value corresponding to the number of capacitors included in the modulation cap bank of the VCO.

The VCO adjusts the modulation cap bank. The VCO may change the frequency of the VCO output signal by connecting the corresponding capacitor of the modulation cap bank according to the modulation control signal. The modulation cap bank may include capacitors of the same area connected in parallel. By changing the capacitance by connecting a set number of capacitors in parallel according to the modulation control signal, the frequency of the VCO output signal may be modulated to the frequency used for FSK, etc.

A frequency of the VCO output signal is measured (S1135). The number of peaks in the VCO output signal is measured using the counter. The digital controller may determine a frequency using the number of peaks measured by the counter and a measurement time.

The digital controller may check a termination condition (S1145). The termination condition may be determined based on whether a modulation control signal is input a predesignated number of times or a modulation control signal of a specified value is input.

When the termination condition is not satisfied in a modulation control signal to be additionally performed, repetition may be performed from the step of changing the modulation control signal (S1155) and transmitting the modulation control signal to the VCO (S1125).

When the termination condition is satisfied, the digital controller may determine a frequency change value according to the modulation control signal (S1165). By measuring frequencies of at least two modulation control signals, a relationship between frequencies of the modulation control signal and the VCO output signal may be determined. When linear regression is applied to a relationship between the number of capacitors and frequency according to the modulation control signal, the change in frequency per capacitor may be determined using a slope.

For example, in the case where the reference frequency is 2 GHz and an FSK modulation frequency is ±200 MHZ (1.8 GHz to 2.2 GHZ), when the modulation cap bank includes 100 capacitors, it is possible to design that the reference frequency is output from 50 capacitors and the FSK modulation frequency is output from ±20 (30 to 70) capacitors. In other words, it is possible to design that 10 MHz can be changed per capacitor.

In this example, when a modulation control signal for 30 capacitors, which is a design value, is transmitted to the VCO, a frequency of the VCO output signal may be measured to be 2.15 GHZ, and when a modulation control signal for 70 capacitors, which is another design value, is transmitted to the VCO, a frequency of the VCO output signal may be measured to be 1.85 GHZ. In this case, the amount of frequency change per capacitor of the modulation cap bank according to the modulation control signal may be obtained by an equation of Actual frequency modulation amount/Number of capacitors used for frequency modulation=(Measured actual frequency−Reference frequency)/(Medium number of total capacitors−Number of capacitors used for frequency modulation)=150 MHz/(50−30)=7.5 MHZ.

Figure 12:
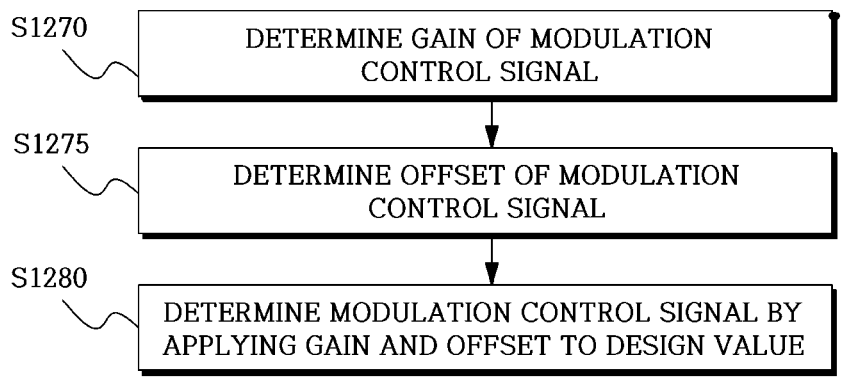
FIG. 12 is a flowchart illustrating a method of determining a modulation control signal in the signal synthesis method capable of correcting an offset of an open loop according to an embodiment.

FIG. 12 is a flowchart illustrating a method of determining a modulation control signal in the signal synthesis method capable of correcting an offset of an open loop according to an embodiment.

According to an additional aspect, the signal synthesis method further includes a step S1270 of comparing a frequency change value according to the modulation control signal with a design value to determine the gain of the modulation control signal.

According to an additional aspect, the signal synthesis method further includes a step S1280 of applying the gain of the modulation control signal and an offset of the modulation control signal to a predetermined design value of the modulation control signal to determine a modulation control signal required for frequency modulation of output data.

The digital controller may determine the gain of the modulation control signal (S1270). The amount of frequency change per capacitor may be different from the design value due to changes in the capacitance of the capacitor of the modulation cap bank depending on the manufacturing process, applied voltage, temperature and humidity environment in use, etc. A value applied to the design value of the modulation control signal to output a frequency corresponding to the design value may be determined as the gain of the modulation control signal.

The digital controller may determine an offset of the modulation control signal for compensating for the frequency offset that occurs when switching from the closed loop to the open loop (S1275). A method of determining the offset of the modulation control signal will be understood with reference to the description of FIG. 10.

A corrected modulation control signal may be determined by applying the gain of the modulation control signal and the offset of the modulation control signal to the design value of the modulation control signal (S1280).

According to a modification, a modulation control signal corrected to correspond to the number of capacitors obtained by multiplying the design value of the number of capacitors corresponding to the modulation control signal by the gain of the modulation control signal may be determined as a corrected modulation control signal.

According to a modification, a modulation control signal corrected to correspond to the number of capacitors obtained by adding the gain of the modulation control signal to the design value of the number of capacitors corresponding to the modulation control signal may be determined as a corrected modulation control signal.

In the previous example, to obtain ±200 MHz as the FSK modulation frequency, a modulation control signal for selecting capacitors of the modulation cap bank to compensate for a decreasing frequency per capacitor needs to be transmitted to the VCO. The corrected modulation control signal may be obtained by multiplying the modulation control signal gain by the number of capacitors in the modulation cap bank used for frequency modulation during design. In this instance, the modulation control signal gain may be obtained by an equation of Target frequency range/Actually measured frequency change=200 MHz/150 MHz=1.333 times. In this case, the modulation control signal may be obtained by an equation of Number of capacitors used for frequency modulation during design*modulation control signal gain=+20*1.333=26.666. Therefore, when the modulation control signal is determined to change ±27 (23 to 77) capacitors of the modulation cap bank and transmit the modulation control signal to the VCO, the frequency of the VCO output signal may satisfy the FSK modulation frequency.

Meanwhile, when operating in the open loop to save power, the digital controller applies the offset of the modulation control signal to the modulation control signal and transmits the corrected modulation control signal to the vco.

In the previous example, when the offset of the modulation control signal is 8, the modulation control signal may be determined by reflecting the offset 8 of the modulation control signal in the modulation control signal with the gain of the modulation control signal corrected. That is, the number of capacitors in the modulation cap bank connected by the modulation control signal may be determined to be 31 to 85 by adding the offset value 8 to ±27 (23 to 77) reflecting the gain. Therefore, in the case where the signal synthesis apparatus is operated in the open loop to save power, when the digital controller changes the modulation control signal to change the number of capacitors of the modulation cap bank between 31 and 85 and transmits the modulation control signal to the VCO, it is possible to obtain a VCO output signal having a frequency matching the FSK modulation frequency in the open loop.

For a plurality of predetermined modulation control signals, the gain of the modulation control signal and the offset of the modulation control signal may be applied in the same manner to determine a plurality of corrected modulation control signals.

Figure 13:
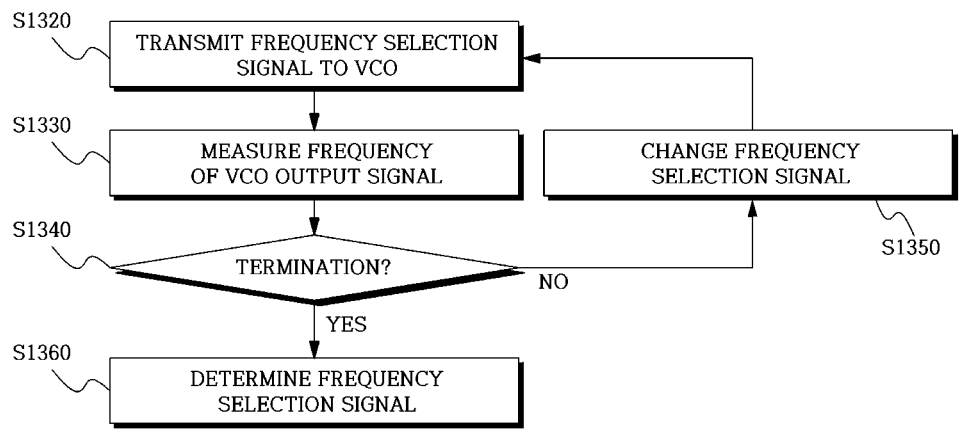
FIG. 13 is a flowchart illustrating a method of determining a frequency selection signal in the signal synthesis method capable of correcting an offset of an open loop according to an embodiment.

FIG. 13 is a flowchart illustrating a method of determining a frequency selection signal in the signal synthesis method capable of correcting an offset of an open loop according to an embodiment.

According to an additional aspect, the signal synthesis method further includes a step of generating a frequency selection signal for controlling the capacitors of the frequency selection cap bank of the VCO and transmitting the frequency selection signal to the VCO (S1320), and measuring a frequency of a VCO output signal output from the VCO (S1330), and a step of changing the frequency selection signal based on a result of comparing the frequency of the VCO output signal with a predetermined reference frequency (S1350).

According to a modification, in the step S1350 of changing the frequency selection signal, the frequency selection signal is changed to sequentially update the connection state from a capacitor having the largest capacitance to a capacitor with having smallest capacitance among the capacitors in the frequency selection cap bank.

According to a modification, the signal synthesis method further includes a step S1360 of terminating a process of changing the frequency selection signal when the frequency of the VCO output signal is within a predetermined error range for the reference frequency, and determining the frequency selection signal used as the VCO output signal as a frequency selection signal used for data output or correction.

When the signal synthesis apparatus operates to output data, the environment may be different each time, and thus it is desirable to perform the method (S1320 to S1360) of determining the frequency selection signal before each data output or correction.

In a process of determining the frequency selection signal, the modulation control signal may use an initial design value.

Figure 14:
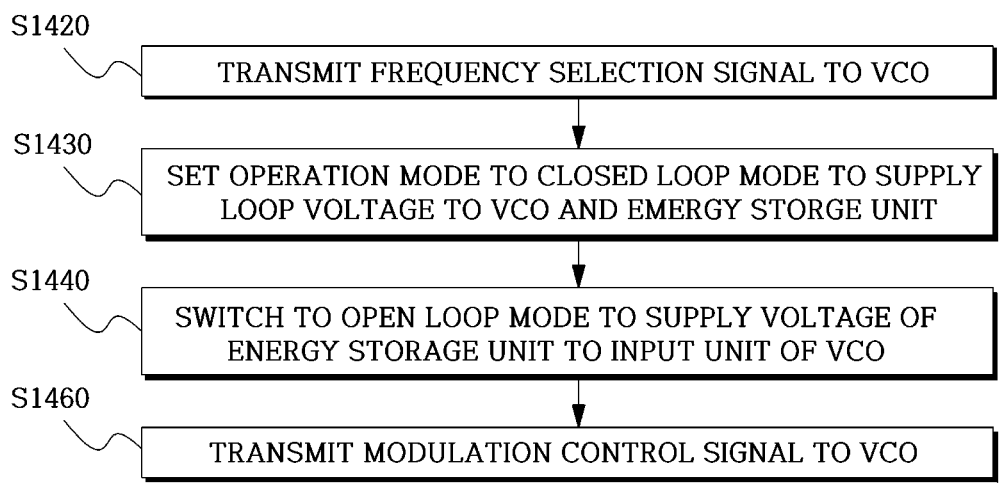
FIG. 14 is a flowchart illustrating a method of outputting a frequency-modulated signal using an offset of the modulation control signal and gain of the modulation control signal in the signal synthesis method capable of correcting an offset of an open loop according to an embodiment.

FIG. 14 is a flowchart illustrating a method of outputting a frequency-modulated signal using the offset of the modulation control signal and the gain of the modulation control signal in the signal synthesis method capable of correcting an offset of an open loop according to an embodiment.

According to additional aspect, the signal an synthesis method further includes a step S1430 of setting the operation mode to the closed loop mode to connect input of the energy storge unit to the input unit of the VCO, and supplying a voltage input to the VCO to the energy storage unit, a step S1440 of switching the operation mode to the open loop mode to connect output of the energy storage unit to the input unit of the VCO, and supplying an output voltage of the energy storage unit to the input unit of the VCO, and a step S1460 of transmitting the modulation control signal to the VCO based on data to be output.

According to a modification, the signal synthesis method further includes a step S1420 of transmitting the frequency selection signal to the VCO before performing the operations (S1430 to S1460) of transmitting the modulation control signal to the VCO to compensate for the frequency offset when switching to the open loop mode.

According to a modification, the signal synthesis method further includes steps S1320 to S1360 of determining the frequency selection signal disclosed in the description of FIG. 13 before performing the step S1420 of transmitting the frequency selection signal to the VCO.

According to a modification, the signal synthesis method further includes steps S1270 to S1280 of determining the modulation control signal disclosed in the description of FIG. 12 before performing the step S1460 of transmitting the modulation control signal to the VCO.

The signal synthesis method according to an embodiment may be performed as follows. First, the offset of the modulation control signal for correcting the frequency offset in the open loop and the gain of the modulation control signal for correcting the frequency gain according to the modulation cap bank are determined in advance. In order to determine the offset of the modulation control signal and the gain of the modulation control signal, a frequency selection signal needs to be first determined so that the signal synthesis apparatus operates in the reference frequency domain.

A frequency selection signal is determined so that the VCO outputs a frequency in the reference frequency domain. To this end, first, a reference voltage is supplied to the input unit of the VCO, and the operation mode of the VCO input selector is set to the closed loop mode. In the closed loop mode, the VCO input selector connects input of the energy storage unit to the input unit of the VCO and supplies the reference voltage input to the VCO to the energy storage unit (S1020).

To determine the frequency selection signal, the steps disclosed in the description of FIG. 13 are performed. That is, a frequency selection signal for connecting the largest capacitor in the frequency selection cap bank is transmitted to the VCO (S1320), a frequency of the VCO output signal is measured (S1330), and the frequency of the VCO output signal is compared with the reference frequency (S1340). When the frequency of the VCO output signal is within an error range with reference to the reference frequency as a result of comparison, a current frequency selection signal is determined as a corrected frequency selection signal to be output to the VCO (S1360). When the error range is exceeded, repetition is performed from the step of changing the frequency selection signal to determine whether to connect the next size capacitor in the frequency selection cap bank (S1350) based on the comparison result between the frequency of the VCO output signal and the reference frequency and transmitting the frequency selection signal to the VCO (S1320).

Upon determining the frequency selection signal for determining whether to connect capacitors of the frequency selection cap bank (S1360), the digital controller transmits the corrected frequency selection signal to the VCO (S1420) to set the signal synthesis apparatus to operate in the reference frequency domain.

Thereafter, the gain of the modulation control signal for correcting the modulated frequency may be determined, and the offset of the modulation control signal for correcting the open loop offset may be determined.

To determine the gain of the modulation control signal, the steps disclosed 11 and 12 are performed. That is, the first modulation control signal is transmitted to the VCO (S1125), the first modulation frequency of the VCO output signal is measured (S1135), and it is verified whether there is a modulation control signal to be additionally changed (S1145). When there is a modulation control signal to be changed, a process of changing the modulation control signal to be transmitted to the VCO to the second modulation control signal (S1155), transmitting the second modulation control signal to the VCO (S1125), and measuring the second modulation frequency of the VCO output signal (S1135) is repeated. When measurement of a modulation frequency for each of the plurality of modulation control signals is completed, a relationship between the number of capacitors connected in the modulation cap bank according to the modulation control signal and the modulation frequency is obtained. From this relationship, a frequency change value per capacitor of the modulation cap bank or a frequency change value according to the modulation control signal is determined (S1165). The gain of the modulation control signal is determined by comparing the difference between the first modulation frequency and the second modulation frequency with a difference according to the design value (S1270).

To determine the offset of the modulation control signal, the steps disclosed in FIG. 11 are first performed to determine a frequency change value according to the modulation control signal (S1165).

To determine the offset of the modulation control signal, the steps disclosed in FIG. 10 are additionally performed. That is, first, the reference voltage is supplied to the input unit of the VCO, and while the VCO input unit is operated in the closed loop mode to supply the VCO input voltage to the energy storage unit (S1020), the closed loop mode frequency of the VCO output signal is measured (S1030). Next, the reference voltage input to the VCO is blocked, the VCO input unit is operated in the open loop mode to supply output of the energy storage unit to the input unit of the VCO (S1040), and the open loop mode frequency of the VCO output signal is measured (S1050). Next, a frequency offset, which is a difference between the closed loop mode frequency and the open loop mode frequency, is determined, and the closed loop mode frequency of the VCO output signal is measured (S1060). Based on the frequency change value according to the predetermined modulation control signal, the offset of the modulation control signal for compensating for the frequency offset when switching to the open loop is determined (S1075).

A modulated frequency matching the designed value in the open loop may be output using the modulation control signal corrected by the offset of the modulation control signal and the gain of the modulation control signal in the signal synthesis apparatus, which may be used for FSK-type data communication.

Since the VCO output frequency may change depending on the usage environment, it is necessary to determine the frequency selection signal again before data output. As described previously, first, the reference voltage is supplied to the input unit of the VCO, and the operation mode of the VCO input selector is set to the closed loop mode to connect input of the energy storage unit to the input unit of the VCO, thereby supplying the reference voltage input to the VCO to the energy storage unit (S1020).

To determine the frequency selection signal, the steps disclosed in the description of FIG. 13 are performed. When the frequency selection signal for determining whether to connect to the capacitors of the frequency selection cap bank is determined (S1360), the digital controller transmits the corrected frequency selection signal to the VCO (S1420) to set the signal synthesis apparatus to operate in the reference frequency domain (Coarse Lock).

The PLL circuit of the signal synthesis apparatus is operated in the closed loop to input the loop voltage delivered from the charge pump to the input unit of the VCO, and the VCO input selector is operated in the closed loop mode to supply the loop voltage to the energy storage unit (S1430). When the signal synthesis apparatus operates in the closed loop, an accurate reference frequency is output after a certain period of time (Fine Lock).

When the reference frequency is output, in order to save power, the signal synthesis apparatus suspends the operation of the charge pump, etc., and switches the VCO input selector to the open loop mode to supply output of the energy storage unit to the input unit of the VCO (S1440).

A signal for performing a control operation to connect capacitors obtained by multiplying the design value of the modulation control signal by the gain of the modulation control signal and adding the offset of the modulation control signal thereto is determined as a corrected modulation control signal (S1280), and the determined modulation control signal is transmitted to the VCO (S1460), thereby compensating for the modulation frequency gain and the frequency offset in the open loop due to an environment, a process, etc.

The frequency-modulated VCO output signal is transmitted to a base station or a wireless AP through an antenna to perform communication.

The signal synthesis apparatus and method capable of correcting the offset of the open loop according to the proposed invention may output an accurate frequency by correcting the offset of the open loop for low-power operation of the PLL circuit.

Furthermore, the proposed invention may rapidly modulate an accurate frequency by generating a modulation control signal for correcting frequency deviation according to a manufacturing process.

Furthermore, the proposed invention may perform stable correction and modulation by correcting frequency deviation due to environmental changes such as temperature and humidity changes using a frequency selection signal.

The present invention has been described above through embodiments with reference to the accompanying drawings. However, the present invention is not limited thereto, and should be interpreted to encompass various modifications that can be easily derived by those skilled in the art. The claims are intended to cover these modifications.

What is claimed is:

1. A signal synthesis apparatus configured to correct an offset between a closed loop and an open loop to output a frequency-modulated signal, the signal synthesis apparatus comprising:
   a voltage-controlled oscillator (VCO) configured to generate an output signal having a frequency corresponding to an input voltage by comprising a modulation cap bank having a plurality of capacitors of the same capacitance and an inductor, and to modulate a frequency of the output signal according to a connection state of the capacitors of the modulation cap bank and the inductor to output a frequency-modulated signal;
   an energy storage unit configured to store energy using an input voltage and to output a voltage based on the stored energy;
   a VCO input selector configured to connect an input unit of the VCO to input of the energy storage unit when an operation mode is a closed loop mode, and to connect the input unit of the VCO to output of the energy storage unit when the operation mode is an open loop mode; and
   a digital controller configured control the operation mode of the VCO input selector and to transmit a modulation control signal for adjusting the connection state of the capacitors of the modulation cap bank to the VCO, wherein the digital controller comprises:
   a frequency offset calculator configured to calculate a frequency offset based on a difference between a closed loop mode frequency of a VCO output signal output from the VCO when the VCO input selector operates in the closed loop mode and an open loop mode frequency of the VCO output signal output from the VCO when the VCO input selector operates in the open loop mode; and
   a modulation control signal offset determinator configured to determine an offset of the modulation control signal to compensate for the frequency offset based on a frequency change value according to a predetermined modulation control signal.

2. The signal synthesis apparatus according to claim 1, wherein the energy storage unit comprises:
   an energy storage element charged with an input voltage; and
   a buffer connected to an output unit of the energy storage element to maintain an output voltage of the energy storage element.

3. The signal synthesis apparatus according to claim 1, further comprising a counter configured to measure a number of peaks of the VCO output signal,
   wherein the digital controller determines a frequency of the VCO output signal based on the number of peaks measured by the counter and a measurement time.

4. The signal synthesis apparatus according to claim 1, wherein the digital controller further comprises a frequency change value determinator according to the modulation control signal for determining a frequency change value according to the modulation control signal based on a difference between frequencies of VCO output signals each measured for each of a plurality of modulation control signals transmitted to the VCO.

5. The signal synthesis apparatus according to claim 1, wherein the digital controller further comprises a modulation control signal gain determinator configured to determine gain of the modulation control signal by comparing the frequency change value according to the modulation control signal with a design value.

6. The signal synthesis apparatus according to claim 5, wherein the digital controller further comprises a modulation control signal determinator configured to determine a modulation control signal required for frequency modulation of output data by applying the gain of the modulation control signal and the offset of the modulation control signal to a predetermined design value of the modulation control signal.

7. The signal synthesis apparatus according to claim 1, wherein:
the VCO further comprises a frequency selection cap bank including capacitors controlled so that the capacitors are connected in parallel or open according to a frequency selection signal, and
the digital controller further comprises a frequency selection signal determinator configured to generate a frequency selection signal, transmit the frequency selection signal to the VCO, and change the frequency selection signal based on a result of comparing a measured frequency of the VCO output signal with a predetermined reference frequency.

8. A signal synthesis method of outputting a frequency-modulated signal by correcting an offset between a closed loop and an open loop, the signal synthesis method comprising:
supplying a reference voltage to an input unit of a VCO and setting a closed loop mode in which input of an energy storage unit is connected to the input unit of the VCO to supply a reference voltage input to the VCO to the energy storage unit;
measuring a frequency of a VCO output signal output from the VCO to determine a closed loop mode frequency;
blocking supply of the reference voltage input to the VCO and switching to an open loop mode in which output of the energy storage unit is connected to the input unit of the VCO to supply an output voltage of the energy storage unit to the input unit of the VCO;
measuring a frequency of the VCO output signal to determine an open loop mode frequency, and calculating a frequency offset based on a difference from the closed loop mode frequency; and
determining an offset of a modulation control signal to compensate for the frequency offset based on a frequency change value according to the modulation control signal for adjusting a connection state of the capacitors of a modulation cap bank.

9. The signal synthesis method according to claim 8, further comprising:
generating a first modulation control signal, transmitting the first modulation control signal to the VCO, and measuring a first modulation frequency of a VCO output signal;
generating a second modulation control signal, transmitting the second modulation control signal to the VCO, and measuring a second modulation frequency of the VCO output signal; and
determining a frequency change value according to a modulation control signal based on a difference between the first modulation frequency and the second modulation frequency.

10. The signal synthesis method according to claim 9, further comprising:
comparing a frequency change value according to the modulation control signal with a design value to determine gain of the modulation control signal; and
applying an offset of the modulation control signal to a predetermined design value of the modulation control signal and gain of the modulation control signal to determine a modulation control signal required for frequency modulation of output data.

11. The signal synthesis method according to claim 10, further comprising:
setting an operation mode to a closed loop mode to connect input of the energy storage unit to the input unit of the VCO, and supplying a voltage input to the VCO to the energy storage unit;
setting the operation mode to an open loop mode to connect output of the energy storage unit to the input unit of the VCO, and supplying an output voltage of the energy storage unit to the input unit of the VCO; and
transmitting the modulation control signal to the VCO based on data to be output.

12. The signal synthesis method according to claim 8, further comprising:
generating a frequency selection signal for controlling a capacitor of a frequency selection cap bank of the VCO, transmitting the frequency selection signal to the VCO, and measuring a frequency of the VCO output signal output from the VCO; and
changing the frequency selection signal based on a result of comparing the frequency of the VCO output signal with a predetermined reference frequency.

* * * * *